US012677674B2

(12) United States Patent
Chang et al.

(10) Patent No.: US 12,677,674 B2
(45) Date of Patent: Jul. 7, 2026

(54) SEMICONDUCTOR WAFER INCLUDING MONITORING PATTERN STRUCTURE WITH COVER PATTERN LAYER AND CONTACT PATTERNS DISPOSED OVER MONITORING PATTERN STRUCTURE

(71) Applicant: SK hynix Inc., Gyeonggi-do (KR)

(72) Inventors: Heon Yong Chang, Gyeonggi-do (KR); Hyeong Geun Joe, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 581 days.

(21) Appl. No.: 18/193,637

(22) Filed: Mar. 31, 2023

(65) Prior Publication Data

US 2024/0145399 A1      May 2, 2024

(30) Foreign Application Priority Data

Oct. 31, 2022    (KR) ........................ 10-2022-0143044

(51) Int. Cl.
| | |
|---|---|
| *H10W 46/00* | (2026.01) |
| *H10P 74/00* | (2026.01) |
| *H10W 42/00* | (2026.01) |
| *H10P 74/20* | (2026.01) |
| *H10W 20/40* | (2026.01) |

(52) U.S. Cl.
CPC ............. *H10W 46/00* (2026.01); *H10P 74/27* (2026.01); *H10W 42/121* (2026.01); *H10P 74/203* (2026.01); *H10P 74/277* (2026.01);

*H10W 20/40* (2026.01); *H10W 20/484* (2026.01); *H10W 46/503* (2026.01)

(58) Field of Classification Search
CPC ..... H01L 22/30; H01L 23/562; H01L 23/544; H01L 22/34; H01L 2223/5446; H01L 22/12; H01L 23/4824; H01L 23/485; H10P 74/27; H10P 74/203; H10P 74/277; H10W 46/00; H10W 42/121; H10W 20/40; H10W 20/484; H10W 46/503
See application file for complete search history.

(56) References Cited

U.S. PATENT DOCUMENTS

| | | | |
|---|---|---|---|
| 8,742,547 B2* | 6/2014 | Yoshizawa ............ | H01L 23/562 |
| | | | 257/E21.705 |
| 2007/0184565 A1 | 8/2007 | Park et al. | |
| 2020/0058543 A1* | 2/2020 | Han ...................... | H01L 23/544 |

FOREIGN PATENT DOCUMENTS

KR      10-2007-0071625  A      7/2007

* cited by examiner

*Primary Examiner* — Britt Hanley
*Assistant Examiner* — Victor V Barzykin
(74) *Attorney, Agent, or Firm* — IP & T GROUP LLP

(57) ABSTRACT

A semiconductor wafer according to an embodiment includes a monitoring pattern structure disposed over a substrate, a cover pattern layer covering portions of the monitoring pattern structure over the substrate, and contact patterns disposed over the cover pattern layer to extend over the cover pattern layer.

18 Claims, 23 Drawing Sheets

1f

1000

121-U

W2

W1

121

121R

H2

1000

121R

121-D

1I

130

145c

140c

H4   H4   H4   H4   H4   H4   H4

SEMICONDUCTOR WAFER INCLUDING MONITORING PATTERN STRUCTURE WITH COVER PATTERN LAYER AND CONTACT PATTERNS DISPOSED OVER MONITORING PATTERN STRUCTURE

CROSS-REFERENCE TO RELATED APPLICATIONS

The present application claims priority under 35 U.S.C. 119(a) to Korean Application No. 10-2022-0143044, filed on Oct. 31, 2022, which is incorporated herein by reference in its entirety.

BACKGROUND

1. Technical Field

The present disclosure generally relates to semiconductor technology and, more particularly, to a semiconductor wafer including a monitoring pattern structure.

2. Related Art

Through a semiconductor integration process, a plurality of semiconductor chip regions including integrated circuits may be formed on a semiconductor wafer. The plurality of semiconductor chip regions may be distinguished from each other by a scribe lane region. The plurality of semiconductor chip regions may be separated from each other through a wafer sawing process to be manufactured into a plurality of semiconductor chips.

The semiconductor wafer may include monitoring patterns formed in regions adjacent to the semiconductor chip regions in order to monitor circuit integration processes performed in the semiconductor chip regions. The monitoring pattern may include a monitoring structure having substantially the same structure as an integrated circuit structure formed in the semiconductor chip region. Structural completeness of the integrated circuit structure may be evaluated by inspecting the monitoring structure instead of the integrated circuit structure.

SUMMARY

A semiconductor wafer according to an embodiment of the present disclosure may include a monitoring pattern structure disposed over a substrate, a cover pattern layer covering portions of the monitoring pattern structure over the substrate, and contact patterns disposed over the cover pattern layer to extend over the cover pattern layer.

A semiconductor device according to another embodiment of the present disclosure may include a monitoring pattern structure disposed in a scribe lane region between chip regions over a substrate, a cover pattern layer covering a portion of the monitoring pattern structure over the substrate, and a stress alleviation structure including contact patterns disposed on the cover pattern layer to extend over the cover pattern layer.

A semiconductor wafer according to another embodiment of the present disclosure may include a monitoring pattern structure disposed in a scribe lane region positioned between a plurality of chip regions of a substrate, a cover pattern layer disposed over an edge of the monitoring pattern structure and including a hole exposing a portion of the monitoring pattern structure, and contact patterns disposed over the cover pattern layer.

DETAILED DESCRIPTION

Figure 1:
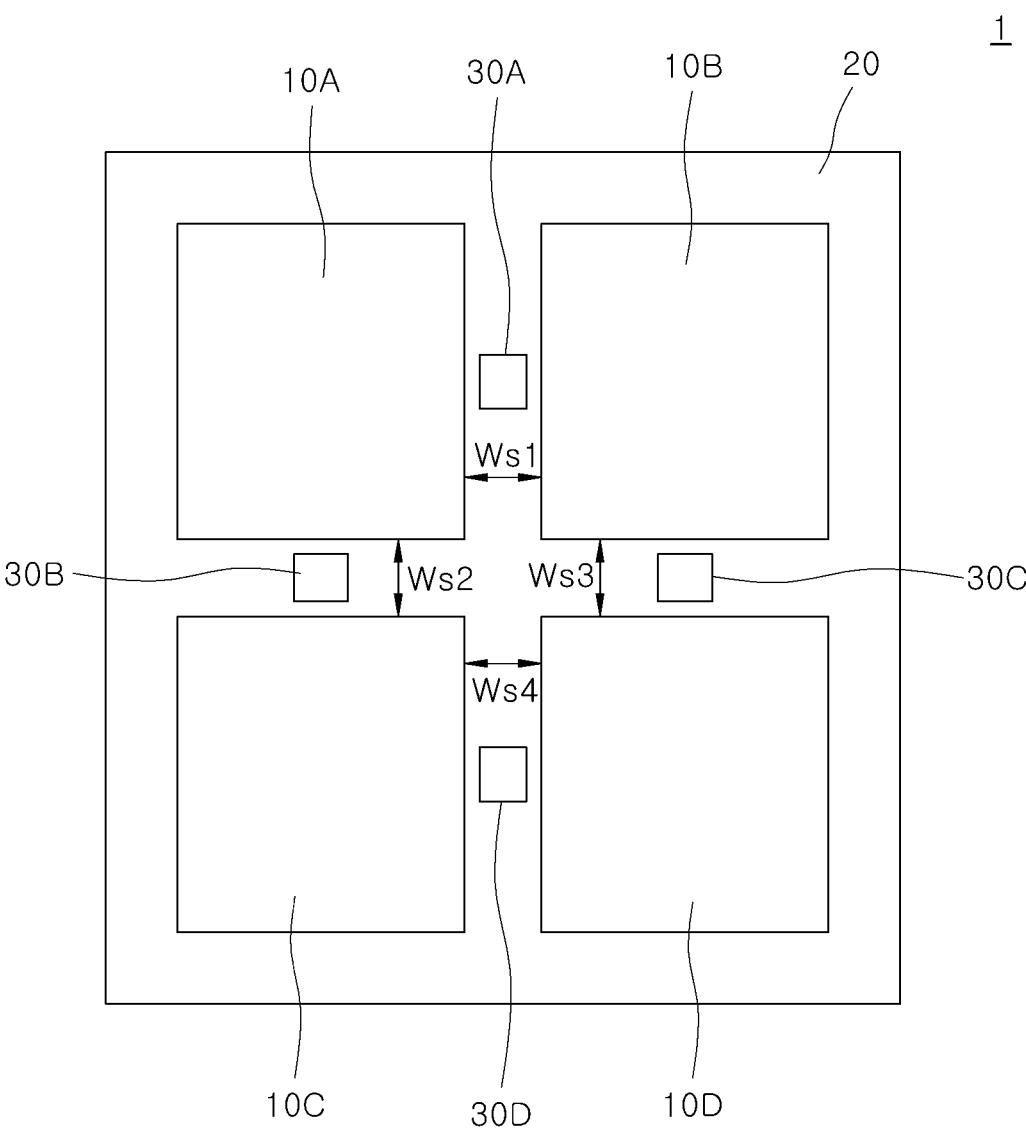
FIG. 1 is a plan view schematically illustrating a semiconductor wafer according to an embodiment of the present disclosure.
Figure 1:
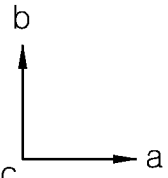

Hereinafter, embodiments of the present disclosure will be described in detail with reference to the accompanying drawings. In the drawings, in order to clearly express the components of each device, the sizes of the components, such as width and thickness of the components, may be enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Terms used in the specification of the present application are terms selected in consideration of functions in the presented embodiments, and the meaning of the terms may vary depending on the intention or custom of a user or operator in the technical field. The meanings of the terms used follow the definitions defined when specifically defined herein, and may be interpreted as meanings generally recognized by those skilled in the art in the absence of specific definitions. In the description of examples of the present application, descriptions such as "first" and "second" are for distinguishing members, and are not used to limit the members themselves or to mean a specific order.

The coordinate system including the a-axis, b-axis, and c-axis and the coordinate system including the x-axis, y-axis, and z-axis described in the specification of the present application may be, for example, a Cartesian coordinate system.

FIG. 1 is a plan view schematically illustrating a semiconductor wafer 1 according to an embodiment of the present disclosure. Referring to FIG. 1, the semiconductor wafer 1 may include a plurality of chip regions 10A, 10B, 10C, and 10D on a substrate, and a scribe lane region 20 positioned between and around the plurality of chip regions 10A, 10B, 10C, and 10D. Referring to FIG. 1, four chip regions 10A, 10B, 10C, and 10D are shown as an example, but the present disclosure is not necessarily limited thereto, and the semiconductor wafer 1 may include various numbers of chip regions.

A semiconductor chip may be formed in each of the plurality of chip regions 10A, 10B, 10C, and 10D by performing a semiconductor integration process on the substrate. The semiconductor chips respectively formed in the plurality of chip regions 10A, 10B, 10C, and 10D may be substantially identical to each other. The semiconductor chip may include various integrated circuits related to operations of the semiconductor chip. After the semiconductor integration process on the substrate is completed, the substrate is separated into the chip regions 10A, 10B, 10C, and 10D, so that the semiconductor chip may be manufactured in the form of a chip.

The scribe lane region 20 may be positioned between the plurality of the chip regions 10A, 10B, 10C, and 10D and outside of the plurality of chip regions 10A, 10B, 10C, and 10D surrounding the chip regions 10A, 10B, 10C, and 10D. After the semiconductor chips are formed on the substrate through the semiconductor integration process, the semiconductor chips may be separated from each other by sawing the scribe lane region 20. A chip guard that protects the plurality of chip regions 10A, 10B, 10C, and 10D, an electrical test pattern, a monitoring pattern, an alignment key pattern, and the like may be disposed in the scribe lane region 20.

Figure 2A:
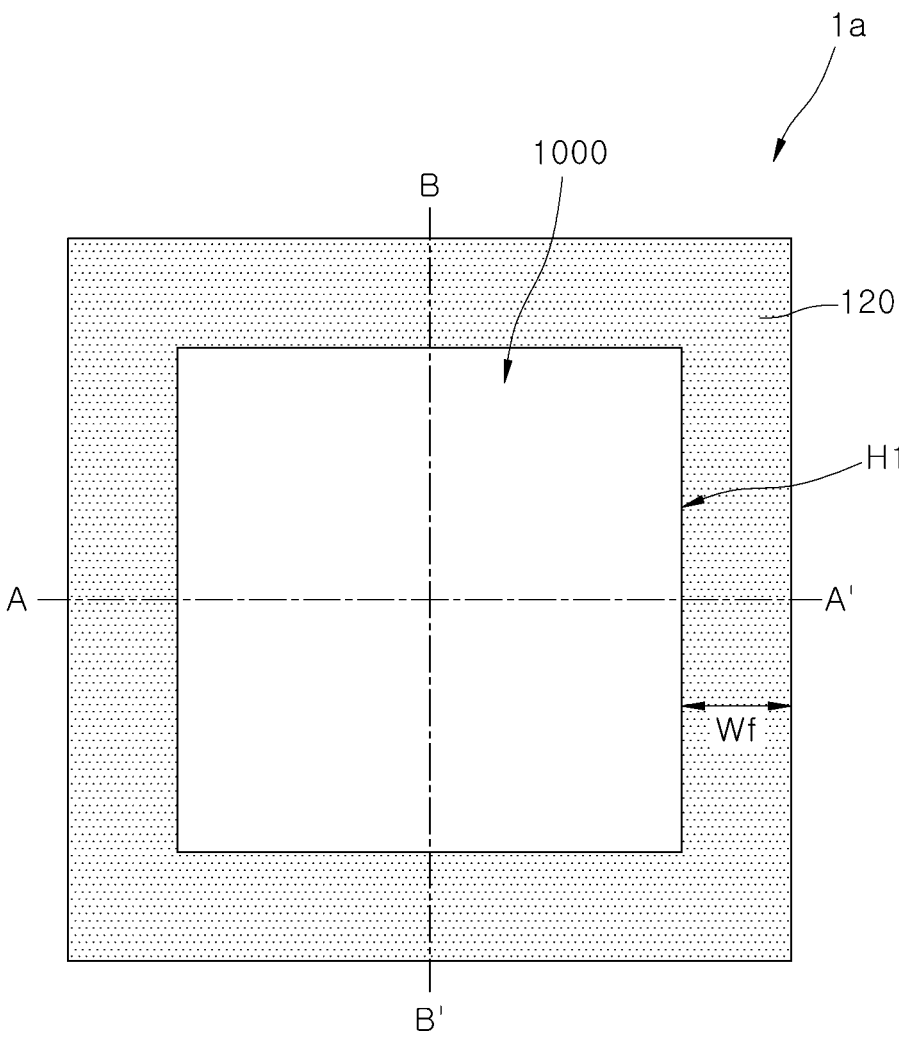
FIG. 2A is a plan view schematically illustrating a semiconductor wafer including a monitoring pattern structure according to an embodiment of the present disclosure.
Figure 2A:
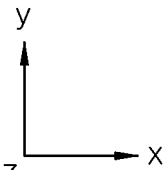
Figure 2B:
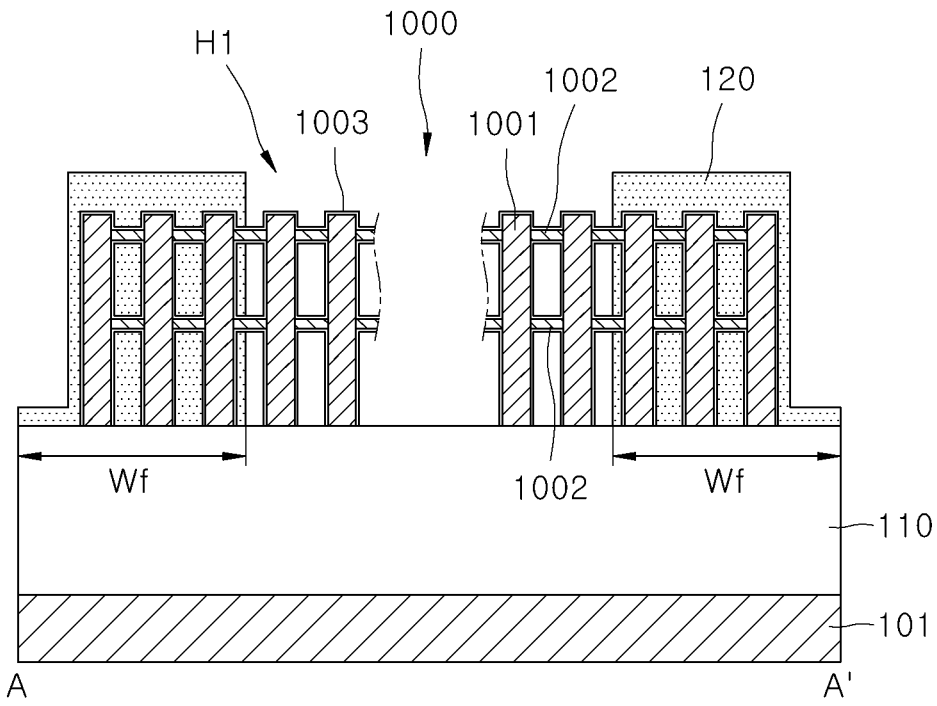
FIG. 2B is a cross-sectional view of the semiconductor wafer of FIG. 2A taken along line A-A' according to an embodiment of the present disclosure.
Figure 2B:
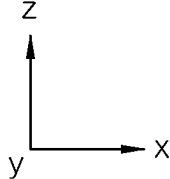
Figure 2C:
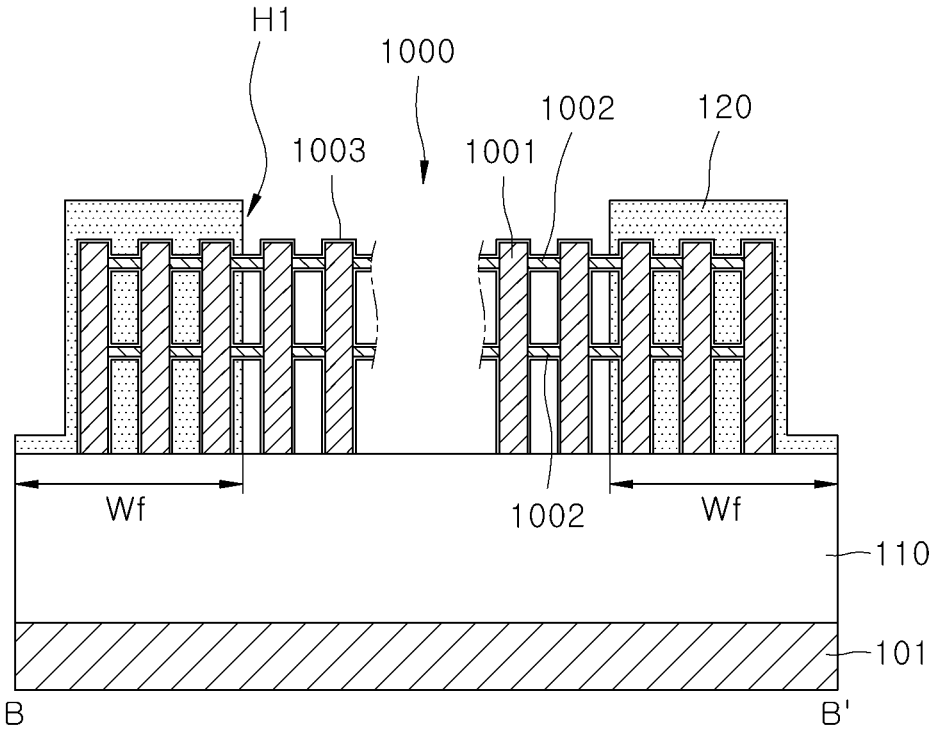
FIG. 2C is a cross-sectional view of the semiconductor wafer of FIG. 2A taken along line B-B' according to an embodiment of the present disclosure.
Figure 2C:
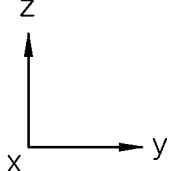

Referring to FIG. 1, monitoring pattern formation regions 30A, 30B, 30C, and 30D may be defined in portions of the scribe lane region 20. Each of the monitoring pattern formation regions 30A, 30B, 30C, and 30D may be a region in which, for example, a monitoring pattern structure 1000 to be described later with reference to FIGS. 2A, 2B, and 2C is formed. Specifically, referring to FIG. 1, first to fourth monitoring pattern formation regions 30A, 30B, 30C, and 30D may be disposed in the scribe lane region 20 that is disposed between the plurality of chip regions 10A, 10B, 10C, and 10D. The first monitoring pattern formation region 30A may be disposed on the scribe lane region 20 between the first and second chip regions 10A and 10B, in which the first and second chip regions 10A and 10B are spaced apart from each other by a first distance Ws1. That is, the scribe lane region 20 may have a width of the first distance Ws1 between the first and second chip regions 10A and 10B. The second monitoring pattern formation region 30B may be disposed on the scribe lane region 20 between the first and third chip regions 10A and 10C, in which the first and third chip regions 10A and 10C are spaced apart from each other by a second distance Ws2. That is, the scribe lane region 20 may have a width of the second distance Ws2 between the first and third chip regions 10A and 10C. The third monitoring pattern formation region 30C may be disposed on the scribe lane region 20 between the second and fourth chip regions 10B and 10D, in which the second and fourth chip regions 10B and 10D are spaced apart from each other by a third distance Ws3. That is, the scribe lane region 20 may have a width of the third distance Ws3 between the second and fourth chip regions 10B and 10D. The fourth monitoring pattern formation region 30D may be disposed on the scribe lane region 20 between the third and fourth chip regions 10C and 10D, in which the third and fourth chip regions 10C and 10D are spaced apart from each other by a fourth distance Ws4. That is, the scribe lane region 20 may have a width of the fourth distance Ws4 between the third and fourth chip regions 10C and 10D.

In an embodiment, although FIG. 1 illustrates the four monitoring pattern formation regions 30A, 30B, 30C, and 30D, the present disclosure is not necessarily limited thereto. Various modifications are possible with respect to the number and position of the monitoring pattern formation regions disposed in the scribe lane region 20.

FIG. 2A is a plan view schematically illustrating a semiconductor wafer 1a including a monitoring pattern structure 1000 according to an embodiment of the present disclosure. FIG. 2B is a cross-sectional view of the semiconductor wafer of FIG. 2A taken along line A-A' according to an embodiment of the present disclosure. FIG. 2C is a cross-sectional view of the semiconductor wafer of FIG. 2A taken along line B-B' according to an embodiment of the present disclosure. Referring to FIGS. 2A to 2C, the monitoring pattern structure 1000 and a cover pattern layer 120 of the semiconductor wafer 1a may be disposed in each of the first to fourth monitoring pattern regions 30A, 30B, 30C, and 30D of the semiconductor wafer 1 described above with reference to FIG. 1.

Referring to FIGS. 2B and 2C, a substrate 101 may be provided. The substrate 101 may include any material suitable of being subjected to a semiconductor integration process. The substrate 101 may include, for example, a semiconductor, an insulator, or a conductor. As an example, the substrate 101 may be a semiconductor substrate. The substrate 101 may have a well region doped with an n-type or a p-type dopant.

In an embodiment, in each of the monitoring pattern formation regions 30A, 30B, 30C, and 30D of FIG. 1, a stack structure 110 may be disposed over or on the substrate 101. The stack structure 110 may include at least one conductive layer and an insulating layer disposed adjacent to the at least one conductive layer. The at least one conductive layer and the insulating layer may be formed together when at least one circuit pattern layer and at least one interlayer insulating layer disposed adjacent to the at least one circuit pattern layer are formed in each of the plurality of chip regions 10A, 10B, 10C, and 10D of the semiconductor wafer 1 of FIG. 1.

Referring to FIGS. 2A to 2C, the monitoring pattern structure 1000 may be disposed over or on the stack structure 110. The monitoring pattern structure 1000 may be formed to monitor an integration circuit process of a semiconductor chip performed in each of the plurality of chip regions 10A, 10B, 10C, and 10D. In an embodiment, the monitoring pattern structure 1000 may be formed to have substantially the same structure as an integrated circuit structure of a cell formed in each of the plurality of chip regions 10A, 10B, 10C, and 10D. By inspecting the monitoring structure 1000 instead of the integrated circuit structure of the cell, the completeness of the integrated circuit structure of the cell may be evaluated. As an example, the inspection method for the monitoring pattern structure 1000 may include an optical critical dimension measurement (hereinafter, referred to as "OCD measurement"). According to the OCD measurement, light is incident on a target pattern structure having a step, and light reflected from the target pattern structure is captured. Subsequently, a side profile of the target pattern structure may be derived by calculating data related to the captured light. In this way, the cross-sectional shape of the target pattern structure may be simulated through the OCD measurement.

In an embodiment, referring to FIGS. 2B and 2C, when the semiconductor chip formed in each of the plurality of chip regions 10A, 10B, 10C, and 10D is a DRAM (Dynamic random-access memory) chip, the semiconductor wafer 1a may include storage node electrodes of cell capacitors and supporters structurally supporting the storage node electrodes, which are formed in each of the plurality of chip regions 10A, 10B, 10C, and 10D. The monitoring pattern structure 1000 may include storage node monitoring structures 1001 and supporter monitoring structures 1002 which correspond to the storage node electrodes and the supporters, respectively. In addition, the monitoring pattern structure 1000 may further include a monitoring dielectric layer 1003 corresponding to a storage node dielectric layer of the cell capacitors.

According to an embodiment, through the OCD measurement for the monitoring pattern structure 1000, for example, a side profile of a cell pattern structure immediately after forming the storage node electrode, a side profile of the cell pattern structure immediately after forming the supporter, and a side profile of the cell pattern structure immediately after forming the storage node dielectric layer may be derived. In this way, when the OCD measurement is applied, there is an advantage in that the profile measurement of the cell pattern structure having a high aspect ratio may be performed within a process line in which a semiconductor integration process is performed.

Referring to FIGS. 2A to 2C, the cover pattern layer 120 may be disposed over the stack structure 110 to cover a portion of the monitoring pattern structure 1000. The cover pattern layer 120 may include a hole pattern H1 that selectively exposes the monitoring pattern structure 1000. As shown in FIG. 2A, the hole pattern H1 may have a quadrangular planar shape, but is not necessarily limited thereto, and in some other embodiments, the hole pattern H1 may have a circular, elliptical, or polygonal planar shape other than the quadrangular shape. In an embodiment, as shown in FIG. 2A, the cover pattern layer 120 may be disposed along an edge of the monitoring pattern structure 1000. As shown in FIGS. 2B and 2C, the cover pattern layer 120 may have a shape of a fence structure having a predetermined width Wf.

In an embodiment, the cover pattern layer 120 may be formed in the same process step as a plate electrode disposed on the storage node dielectric layer in each of the plurality of chip regions 10A, 10B, 10C, and 10D. Accordingly, the cover pattern layer 120 may be made of substantially the same material as the plate electrode. The cover pattern layer 120 may include a conductive material, such as, for example, tungsten nitride (WN).

An insulating layer may be disposed on the monitoring pattern structure 1000 and the cover pattern layer 120 over the stack structure 110. The insulating layer may be disposed to contact the monitoring pattern structure 1000 and the cover pattern layer 120, as an insulating layer 130 shown in FIGS. 3A to 3C to be described later. The insulating layer may serve to electrically insulate the cover pattern layer 120 from other conductive layers over the insulating layer.

The insulating layer may be formed in the same process as the interlayer insulating layer disposed to cover the plate electrode of the cell capacitor in each of the chip regions 10A, 10B, 10C, and 10D. As an example, the insulating layer may include an oxide such as, for example, tetraethyl orthosilicate (TEOS), undoped silica glass (USG), or the like. The oxide may have a porous structure for low permittivity.

In an embodiment, when the cover pattern layer 120 includes metal nitride and the insulating layer includes porous oxide, the cover pattern layer 120 and the insulating layer may have different thermal expansion characteristics. Accordingly, stress may occur inside the cover pattern layer 120 and the insulating layer according to the different thermal expansion characteristics. For example, when the semiconductor wafer 1*a* undergoes thermal processes of the semiconductor integration process, the thermal expansion of the insulating layer due to thermal deformation may be greater than that of the cover pattern layer 120. As a contact area between the cover pattern layer 120 and the insulating layer increases, stress generated between the cover pattern layer 120 and the insulating layer due to the different thermal expansion may increase. Accordingly, when the stress exceeds a critical value, a phenomenon in which the insulating layer is separated from the cover pattern layer 120 may occur.

According to an embodiment of the present disclosure, because the cover pattern layer 120 includes the hole pattern H1, the contact area between the cover pattern layer 120 and the insulating layer may be reduced. Accordingly, the stress generated between the cover pattern layer 120 and the insulating layer due to their different thermal expansions is significantly reduced. As a result, peeling of the insulating layer over the stack structure 110 is significantly reduced or prevented.

Figure 3A:
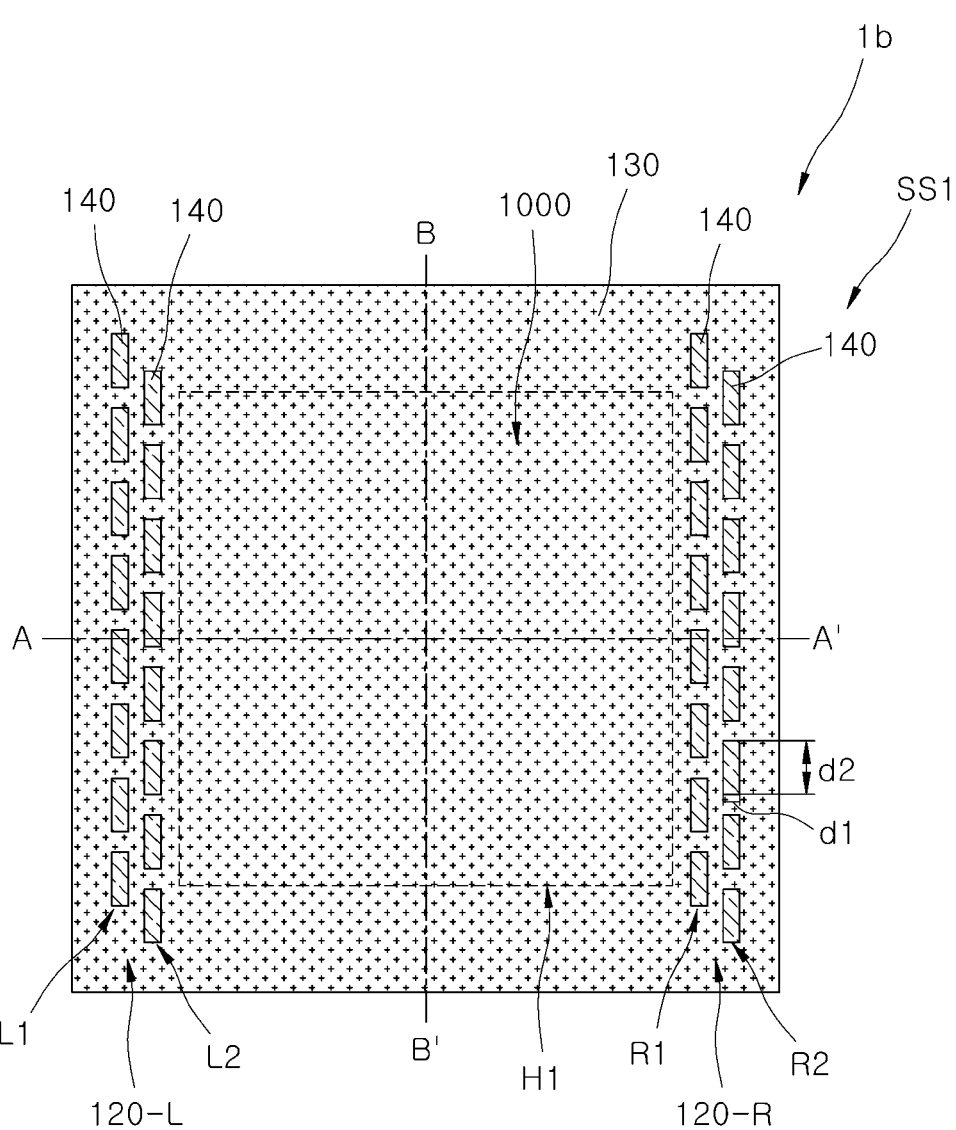
FIG. 3A is a plan view schematically illustrating a semiconductor wafer including a monitoring pattern structure according to another embodiment of the present disclosure.
Figure 3A:
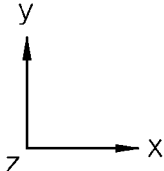
Figure 3B:
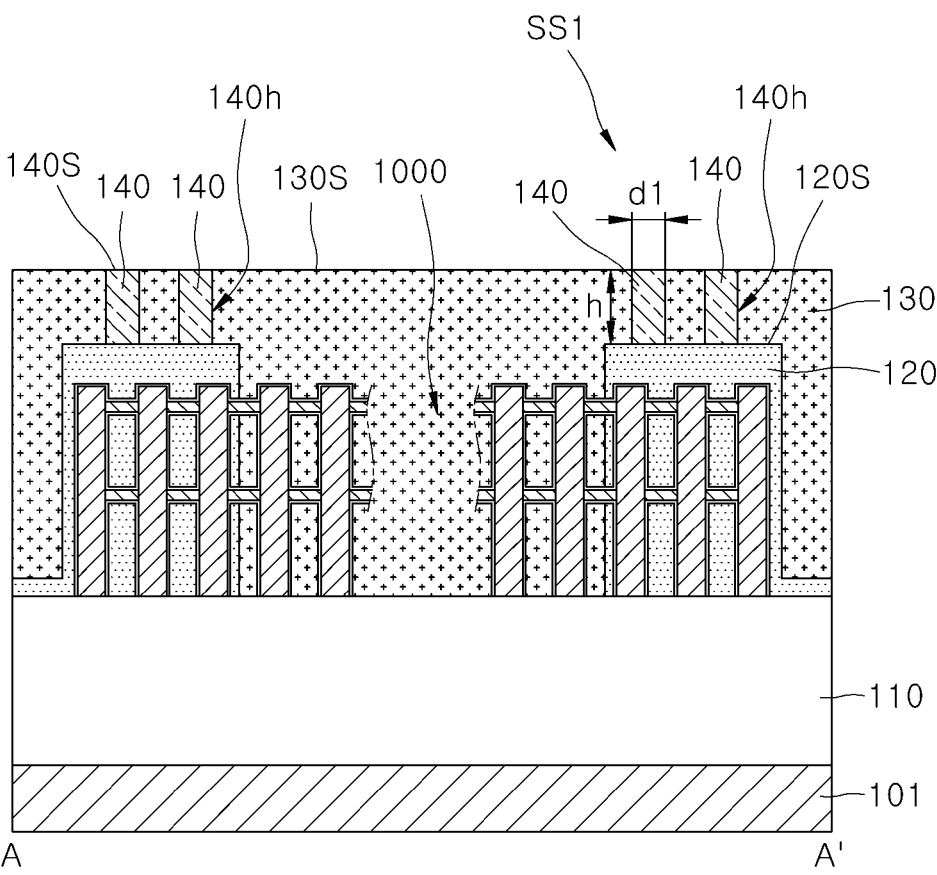
FIG. 3B is a cross-sectional view of the semiconductor wafer of FIG. 3A taken along line A-A' according to an embodiment of the present disclosure.
Figure 3B:
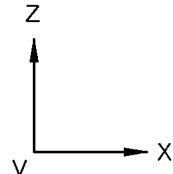
Figure 3C:
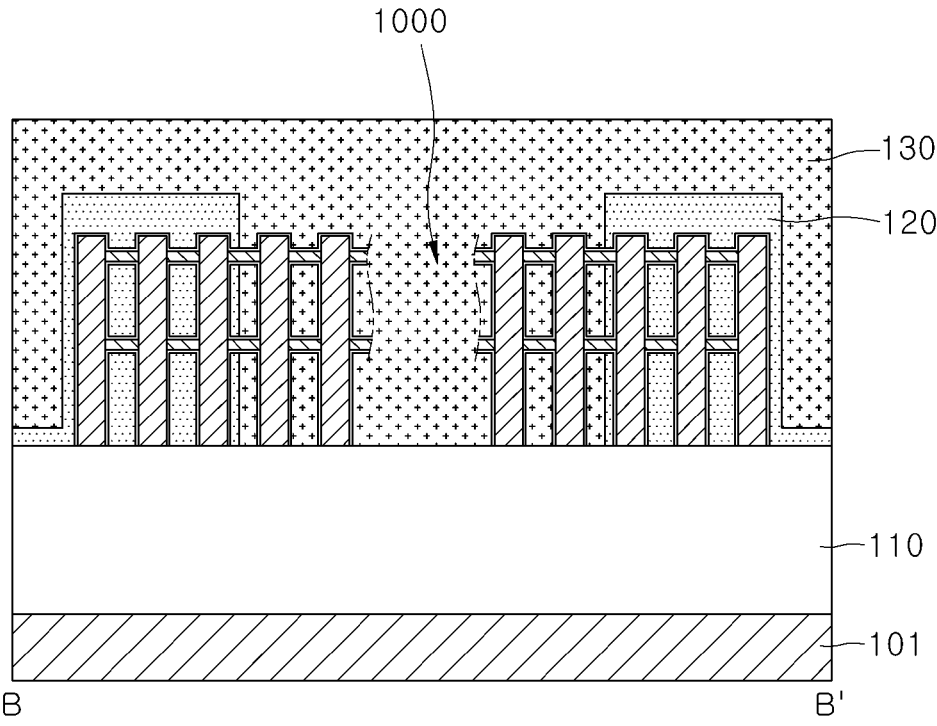
FIG. 3C is a cross-sectional view of the semiconductor wafer of FIG. 3A taken along line B-B' according to an embodiment of the present disclosure.
Figure 3C:
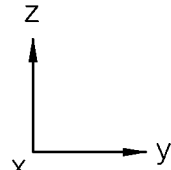

FIG. 3A is a plan view schematically illustrating a semiconductor wafer 1*b* including a monitoring pattern structure 1000 according to another embodiment of the present disclosure. FIG. 3B is a cross-sectional view of the semiconductor wafer of FIG. 3A taken along line A-A' according to an embodiment of the present disclosure. FIG. 3C is a cross-sectional view of the semiconductor wafer of FIG. 3A taken along line B-B' according to an embodiment of the present disclosure.

Referring to FIGS. 3A to 3C, compared to the semiconductor wafer 1*a* of FIGS. 2A to 2C, the semiconductor wafer 1*b* may further include contact patterns 140 disposed on the cover pattern layer 120. In an embodiment, the contact patterns 140 may be disposed on the cover pattern layer 120 to extend upward of the cover pattern layer 120, for example, in the z-direction.

The contact patterns 140 may be disposed on an upper surface 120S of the cover pattern layer 120, and may include pillar structures arranged in one direction (e.g., the y-direction). As an example, each of the pillar structures may have a shape of a quadrangular pillar having a width d1 along the x-direction, a length d2 along the y-direction, and a height h1 along the z-direction. In an embodiment, the pillar structure may have a shape of a cylinder pillar, an elliptical pillar, or various polygonal pillars.

Referring to FIGS. 3A to 3C, the contact patterns 140 may be arranged on first and second portions 120-L and 120-R of the cover pattern layer 120 positioned on the left and right sides of the hole pattern H1. The contact patterns 140 may be arranged in plural columns L1 and L2 along the y-direction on the first portion 120-L of the cover pattern layer 120. Similarly, the contact patterns 140 may be arranged in plural columns R1 and R2 along the y-direction on the second portion 120-R of the cover pattern layer 120. In FIGS. 3A to 3C, the contact patterns 140 are arranged in two columns on the first and second portions 120-L and 120-R, but are not limited thereto, and the number of columns in which contact patterns 140 are arranged may be other various numbers.

In an embodiment, the contact patterns 140 may be arranged along a direction substantially perpendicular to a width direction of the scribe lane region 20 of FIG. 1. As an example, when the monitoring pattern structure 1000 and the cover pattern layer 120 of the semiconductor wafer 1*b* shown in FIGS. 3A to 3C are disposed in the first monitoring pattern formation region 30A or the fourth monitoring pattern formation region 30D of the semiconductor wafer 1 of FIG. 1, the contact patterns 140 of FIGS. 3A to 3C may be arranged along the b-direction perpendicular to the width direction (i.e., a-direction) of the scribe lane region 20 in FIG. 1. As another example, when the monitoring pattern structure 1000 and the cover pattern layer 120 of the semiconductor wafer 1*b* shown in FIGS. 3A to 3C are disposed in the second monitoring pattern formation region 30B or the third monitoring pattern formation region 30C of the semiconductor wafer 1 of FIG. 1, the contact patterns 140 of FIGS. 3A to 3C may be arranged along the a-direction perpendicular to the width direction (i.e., b-direction) of the scribe lane region 20 in FIG. 1. In an embodiment, the contact patterns 140 are arranged along the direction substantially perpendicular to the width direction of the scribe lane region 20, so that the contact patterns 140 might not be cut in the scribe lane region 20 when the plurality of chip regions 10A, 10B, 10C, and 10D are separated into semiconductor chips by the wafer sawing process.

Referring to FIGS. 3A to 3C, an insulating layer 130 may be disposed over the stacked structure 110. The insulating layer 130 may be disposed to contact the monitoring pattern structure 1000, the cover pattern layer 120, and the contact patterns 140. The insulating layer 130 may include an oxide, such as, for example, tetraethyl orthosilicate (TEOS), undoped silica glass (USG), or the like. The oxide may have a porous structure for low permittivity. Although not specifically shown in FIGS. 3A to 3C, the insulating layer 130 may be formed in a single layer or multiple layers.

In an embodiment, a process of forming the contact patterns 140 may include, forming an insulating layer 130 to cover the monitoring pattern structure 1000 and the cover pattern layer 120 over the stack structure 110. Next, the insulating layer 130 may be selectively etched to form contact hole patterns 140*h* selectively exposing the cover pattern layer 120. Subsequently, the contact hole patterns 140*h* may be filled with metal to form the contact patterns 140. In an embodiment, a planarization process may be performed so that an upper surface 140S of each of the contact patterns 140 and an upper surface 130S of the insulating layer 130 may be positioned at substantially the same level.

In an embodiment, the cover pattern layer 120 may include nitride of a first metal, and the contact pattern 140 may include the first metal. As an example, the cover pattern layer 120 may include tungsten nitride (WN), and the contact pattern 140 may include tungsten (W). In another embodiment, the cover pattern layer 120 may include nitride of a first metal, and the contact pattern 140 may include a second metal that is different from the first metal. As an example, the cover pattern layer 120 may include tungsten nitride (WN), and the contact pattern 140 may include copper (Cu).

The contact patterns 140 may serve to relieve stress generated in the cover pattern layer 120 and the insulating layer 130. As described above, when the cover pattern layer 120 is made of a metal nitride and the insulating layer 130 is made of a porous oxide, stress may occur in the interface between the cover pattern layer 120 and the insulating layer 130 due to their different thermal expansion characteristics. In a conventional device, when the stress exceeds a critical value, a phenomenon in which the insulating layer 130 is separated from the cover pattern layer 120 occurs. According to an embodiment of the present disclosure, the contact patterns 140 may penetrate the insulating layer 130 and be disposed to contact the cover pattern layer 120, so that the contact patterns 140 serve as barriers alleviating the stress which propagates in a lateral direction (e.g., the x-direction or the y-direction) inside the insulating layer 130. As a result, the adhesion between the cover pattern layer 120 and the insulating layer 130 is significantly improved, and peeling of the insulating layer 130 may be significantly reduced or prevented.

According to a simulation experiment, when the contact patterns 140 are disposed over the cover pattern layer 120, the stress in the insulating layer 130 may be relieved by up to 54%, compared to the case in which no contact patterns are used. In addition, according to another simulation, when the cover pattern layer 120 is made of tungsten nitride (WN) and the contact pattern 140 is made of tungsten (W), the stress in the insulating layer 130 may be relieved by about 43%. In addition, when the cover pattern layer 120 is made of tungsten nitride (WN) and the contact pattern 140 is made of copper (Cu), the stress in the insulating layer 130 may be relieved by about 16%.

As described above, in an embodiment of the present disclosure, the semiconductor wafer 1b may include a stress alleviation structure SS1 disposed over the monitoring pattern structure 1000. The stress alleviation structure SS1 may include the contact patterns 140 connected to the cover pattern layer 120. The stress alleviation structure SS1 may alleviate a peeling phenomenon of the insulating layer 130 caused by the different thermal expansions.

Figure 4A:
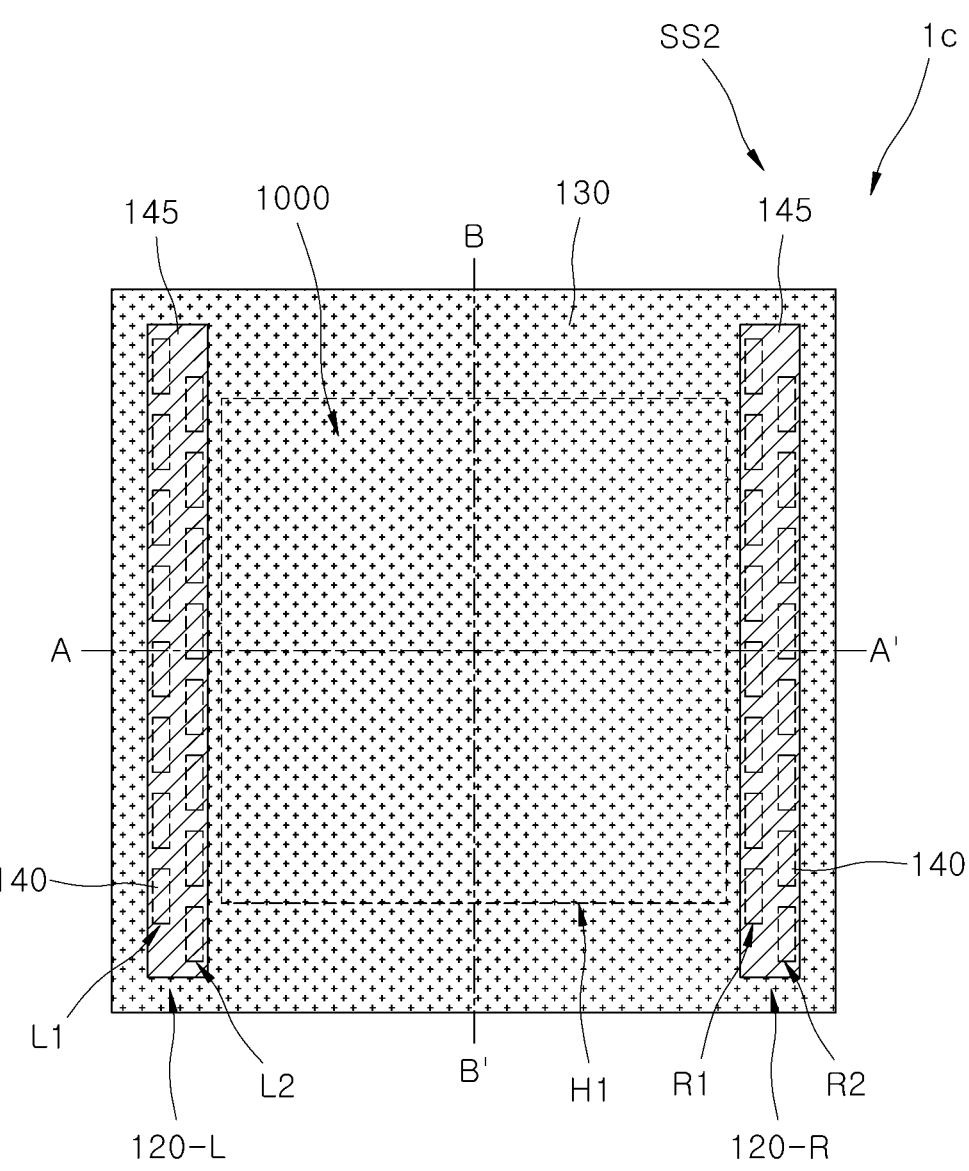
FIG. 4A is a plan view schematically illustrating a semiconductor wafer including a monitoring pattern structure according to yet another embodiment of the present disclosure.
Figure 4A:
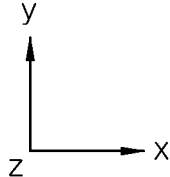
Figure 4B:
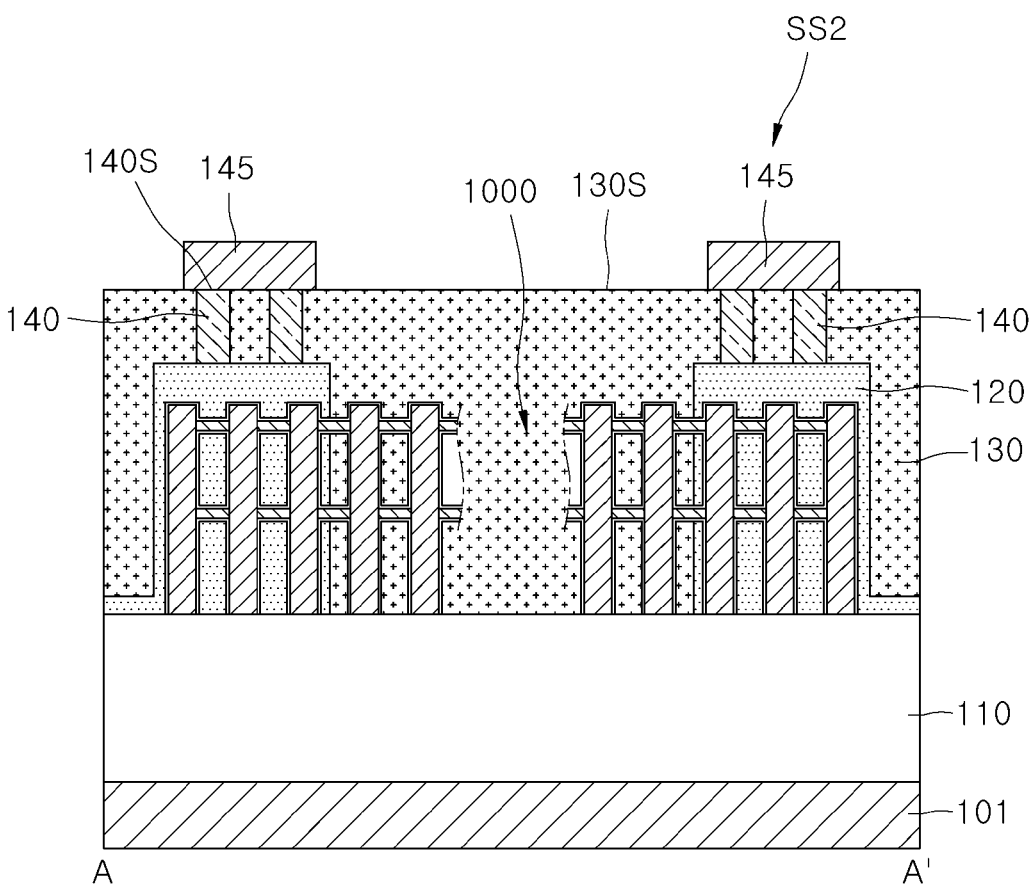
FIG. 4B is a cross-sectional view of the semiconductor wafer of FIG. 4A taken along line A-A' according to an embodiment of the present disclosure.
Figure 4B:
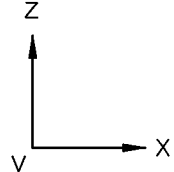
Figure 4C:
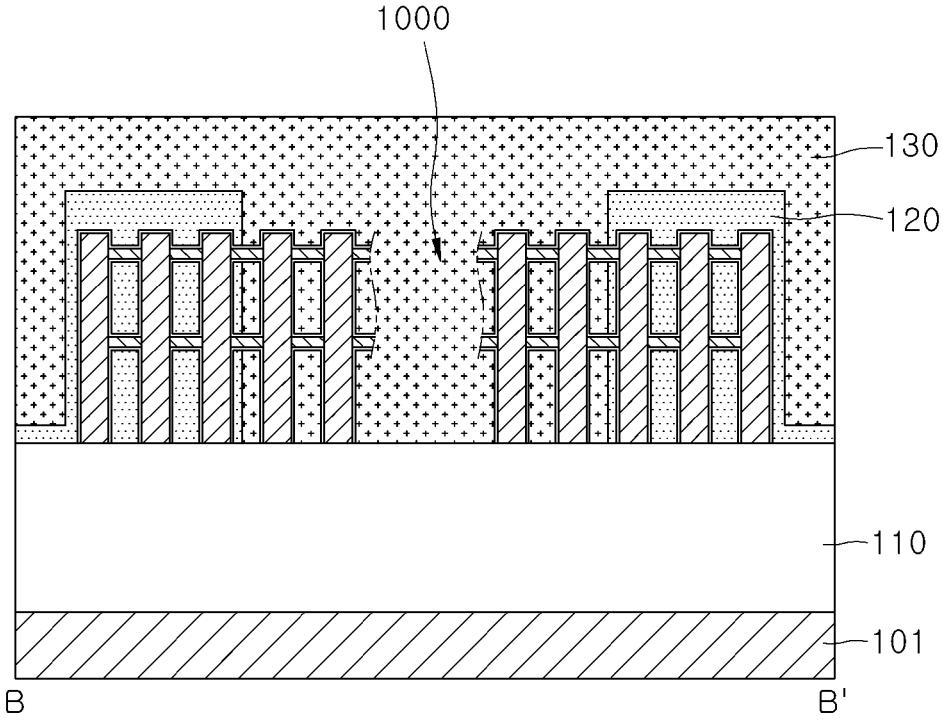
FIG. 4C is a cross-sectional view of the semiconductor wafer of FIG. 4A taken along line B-B' according to an embodiment of the present disclosure.
Figure 4C:
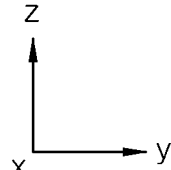

FIG. 4A is a plan view schematically illustrating a semiconductor wafer 1c including a monitoring pattern structure 1000 according to yet another embodiment of the present disclosure. FIG. 4B is a cross-sectional view of the semiconductor wafer of FIG. 4A taken along line A-A' according to an embodiment of the present disclosure. FIG. 4C is a cross-sectional view of the semiconductor wafer of FIG. 4A taken along line B-B' according to an embodiment of the present disclosure.

Referring to FIGS. 4A to 4C, the semiconductor wafer 1c may further include a connection pattern layer 145 disposed on surfaces 130S and 140S over the cover pattern layer 120 to cover contact patterns 140, compared to the semiconductor wafer 1b of FIGS. 3A to 3C.

In an embodiment, the connection pattern layer 145 may be disposed to extend in a direction (e.g., the y-direction) over the first and second portions 120-L and 120-R of the cover pattern layer 120 positioned on the left and right sides of the hole pattern H1. In an embodiment, the connection pattern layer 145 may be disposed to simultaneously cover the contact patterns 140 arranged in plural columns L1 and L2 on an upper portion of the first portion 120-L of the cover pattern layer 120. In addition, the connection pattern layer 145 may be disposed to simultaneously cover the contact patterns 140 arranged in plural columns R1 and R2 over an upper portion of the second portion 120-R of the cover pattern layer 120.

In an embodiment, the connection pattern layer 145 of FIGS. 4A to 4C may be disposed to extend in a direction substantially perpendicular to a width direction of the scribe lane region 20 of FIG. 1. As an example, when the monitoring pattern structure 1000, the cover pattern layer 120, and the contact patterns 140 of the semiconductor wafer 1c shown in FIGS. 4A to 4C are disposed in the first monitoring pattern formation region 30A or the fourth monitoring pattern formation region 30D of the semiconductor wafer 1 of FIG. 1, the connection pattern layer 145 of FIGS. 4A to 4C may be disposed to extend along a b-direction that is perpendicular to the width direction (i.e., a-direction) of the scribe lane region 20 in FIG. 1. As another example, when the monitoring pattern structure 1000, the cover pattern layer 120, and the contact patterns 140 of the semiconductor wafer 1b shown in FIGS. 4A to 4C are disposed in the second monitoring pattern formation region 30B or the third monitoring pattern formation region 30C of the semiconductor wafer 1 of FIG. 1, the connection pattern layer 145 of FIGS. 4A to 4C may be disposed to extend along the a-direction that is perpendicular to the width direction (i.e., b-direction) of the scribe lane region 20 in FIG. 1. In an embodiment, the connection pattern layer 145 may be disposed along the direction substantially perpendicular to the width direction of the scribe lane region 20, so that the connection pattern layer 145 in the scribe lane region 20 might not be cut when the plurality of chip regions 10A, 10B, 10C, and 10D are separated into semiconductor chips by the wafer sawing process.

In an embodiment, the cover pattern layer 120 may include nitride of a first metal, the contact pattern 140 may include the first metal, and the connection pattern layer 145 may include a second metal that is different from the first metal. As an example, the cover pattern layer 120 may include tungsten nitride (WN), the contact pattern 140 may include tungsten (W), and the connection pattern layer 145 may include copper (Cu). In another embodiment, the cover pattern layer 120 may include nitride of a first metal, and the contact pattern 140 and the connection pattern layer 145 may include a second metal that is different from the first metal. As an example, the cover pattern layer 120 may include tungsten nitride (WN), and the contact pattern 140 and the connection pattern layer 145 may include copper (Cu).

In an embodiment, the connection pattern layer 145 may be formed by forming a metal layer on the upper surfaces 103S and 140S of the insulating layer 130 and the contact patterns 140, respectively, and then selectively etching the metal layer to form a metal pattern layer.

As described above, in an embodiment of the present disclosure, the semiconductor wafer 1c may include a stress alleviation structure SS2 including the contact patterns 140 and the connection pattern layer 145 that are disposed over the monitoring pattern structure 1000 and connected to the cover pattern layer 120. The connection pattern layer 145 may be disposed to cover the contact patterns 140 inside the insulating layer 130, so that peeling of the insulating layer 130 is significantly reduced or prevented.

Figure 5A:
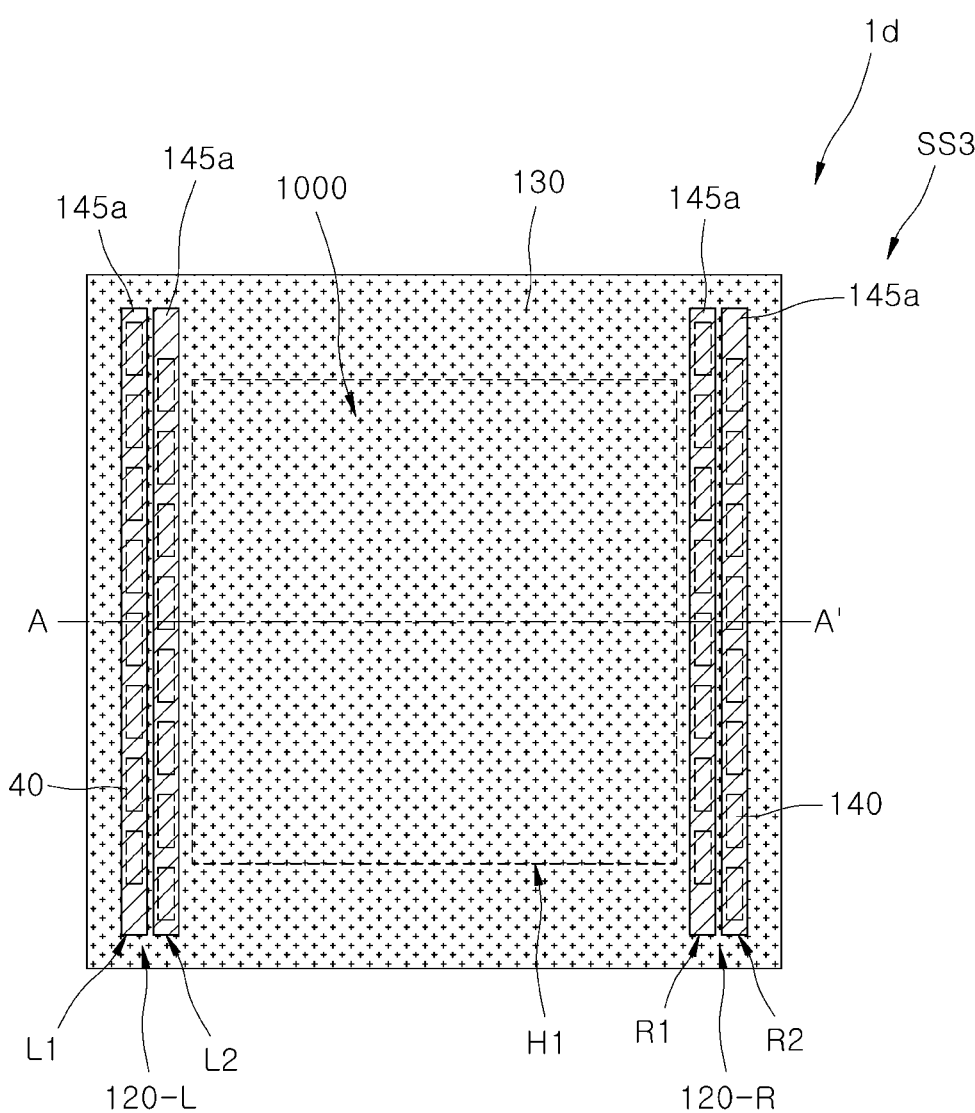
FIG. 5A is a plan view schematically illustrating a semiconductor wafer including a monitoring pattern structure according to yet another embodiment of the present disclosure.
Figure 5A:
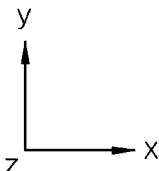
Figure 5B:
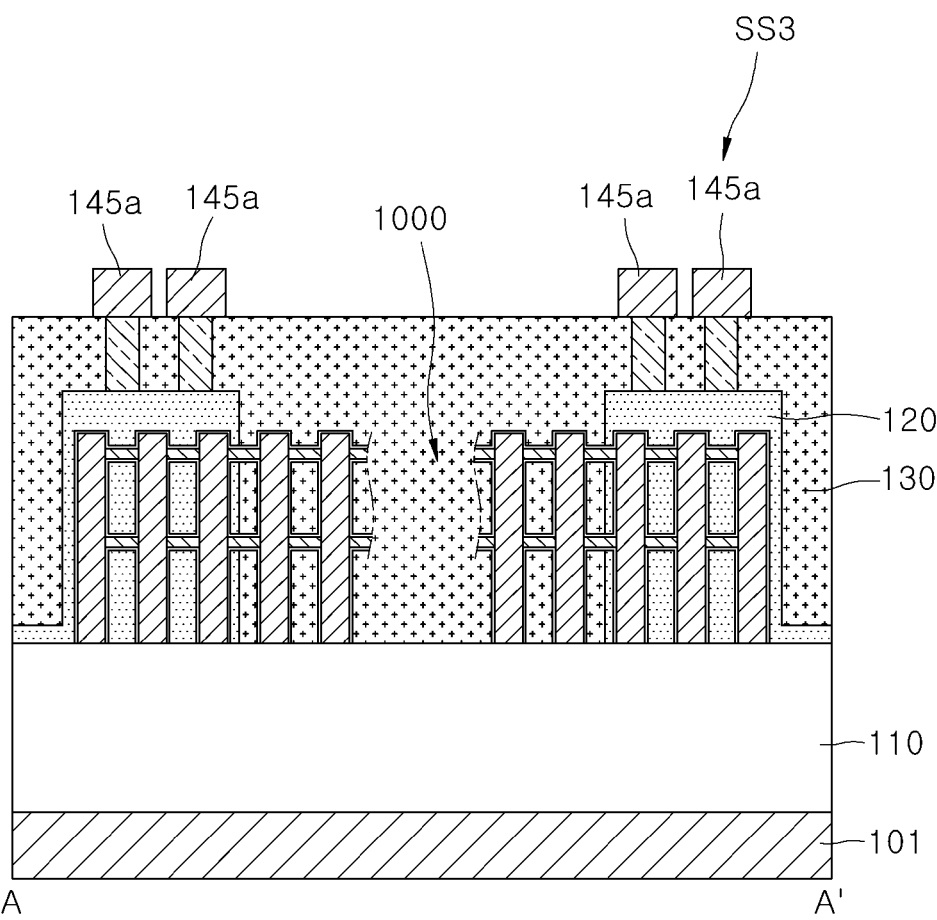
FIG. 5B is a cross-sectional view of the semiconductor wafer of FIG. 5A taken along line A-A' according to an embodiment of the present disclosure.
Figure 5B:
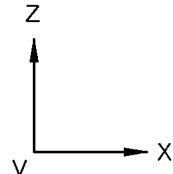

FIG. 5A is a plan view schematically illustrating a semiconductor wafer 1d including a monitoring pattern structure 1000 according to yet another embodiment of the present disclosure. FIG. 5B is a cross-sectional view of the semiconductor wafer of FIG. 5A taken along line A-A' according to an embodiment of the present disclosure.

Referring to FIGS. 5A and 5B, compared to the semiconductor wafer 1c of FIGS. 4A to 4C, the semiconductor wafer 1d may be different from the semiconductor wafer 1c in a configuration of a connection pattern layer 145a. Referring to FIGS. 5A to 5C, the connection pattern layer 145a may be disposed to extend in a direction (e.g., the y-direction) over first and second portions 120-L and 120-R of a cover pattern layer 120, which are respectively located on left and right sides of a hole pattern H1. The connection pattern layer 145a may be disposed to cover contact patterns 140 disposed in plural columns L1 and L2 over the first portion 120-L of the cover pattern layer 120. The connection pattern layer 145a may be disposed to cover the contact patterns 140 disposed in plural columns L1 and L2 over the second portion 120-R of the cover pattern layer 120.

As described above, in an embodiment of the present disclosure, the semiconductor wafer 1d may include a stress alleviation structure SS3 that is disposed over the monitoring pattern structure 1000 and includes the contact patterns 140 and the connection pattern layer 145a connected to the cover pattern layer 120. The connection pattern layer 145a may be disposed to cover the contact patterns 140 arranged in plural columns in an insulating layer 130, so that peeling of the insulating layer 130 is significantly reduced or prevented.

Figure 6A:
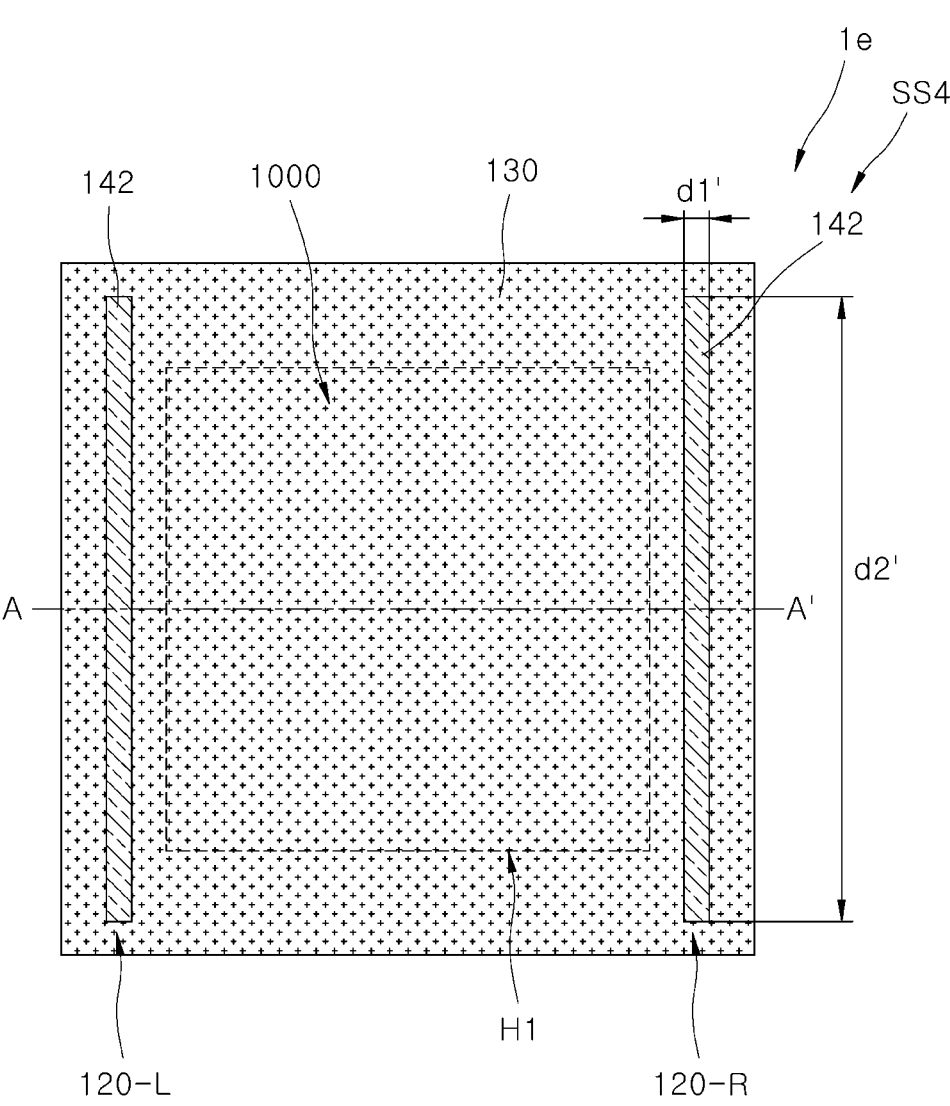
FIG. 6A is a plan view schematically illustrating a semiconductor wafer including a monitoring pattern structure according to yet another embodiment of the present disclosure.
Figure 6A:
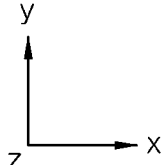
Figure 6B:
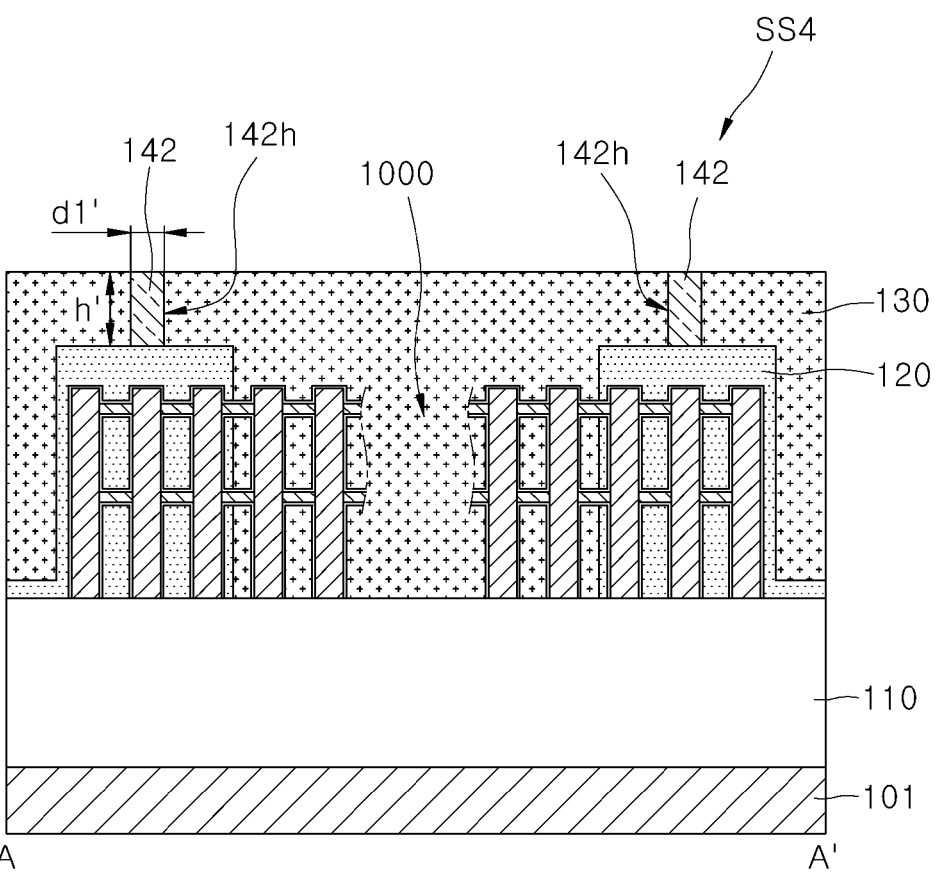
FIG. 6B is a cross-sectional view of the semiconductor wafer of FIG. 6A taken along line A-A' according to an embodiment of the present disclosure.
Figure 6B:
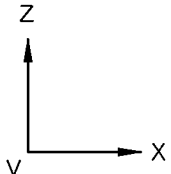

FIG. 6A is a plan view schematically illustrating a semiconductor wafer 1e including a monitoring pattern structure 1000 according to yet another embodiment of the present disclosure. FIG. 6B is a cross-sectional view of the semiconductor wafer of FIG. 6A taken along line A-A' according to an embodiment of the present disclosure.

Referring to FIGS. 6A and 6B, compared to the semiconductor wafer 1b of FIGS. 3A to 3C, the semiconductor wafer 1e may be different from the semiconductor wafer 1b in the configuration of the contact patterns 142. Referring to FIGS. 6A and 6B, the contact patterns 142 may include wall structures extending in a direction (e.g., the y-direction) over first and second portions 120-L and 120-R of a cover pattern layer 120, located on the left and right sides of a hole pattern H1. The wall structure may have a shape of a square pillar having a width d1' along the x-direction, a length d2' along the y-direction, and a height h1' along the z-direction. In an embodiment, the wall structure may have a shape of a cylindrical pillar, an elliptical pillar, or various polygonal pillars.

In an embodiment, the contact patterns 142 of FIGS. 6A and 6B may extend along a direction substantially perpendicular to a width direction of the scribe lane region 20 of FIG. 1. As an example, when the monitoring pattern structure 1000 and the cover pattern layer 120 of the semiconductor wafer 1e shown in FIGS. 6A and 6B are disposed in the first monitoring pattern formation region 30A or the fourth monitoring pattern formation region 30D of FIG. 1, the contact patterns 142 of FIGS. 6A and 6B may be disposed to extend along a b-direction perpendicular to the width direction (i.e., a-direction) of a scribe lane region 20 in FIG. 1. As another example, when the monitoring pattern structure 1000 and the cover pattern layer 120 of the semiconductor wafer 1e shown in FIGS. 6A and 6B are disposed in the second monitoring pattern formation region 30B or the third monitoring pattern formation region 30C of FIG. 1, the contact patterns 142 of FIGS. 6A and 6B may be disposed to extend along the a-direction perpendicular to the width direction (i.e., b-direction) of the scribe lane region 20 in FIG. 1.

Referring to FIG. 6A, on the plan view, each of the contact patterns 142 may be disposed in the form of a single line pattern over each of the first and second portions 120-L and 120-R of the cover pattern layer 120, but the invention may not necessarily be limited thereto. For example, in an embodiment, the contact patterns 142 may be disposed in the form of plural parallel lines over the first and second portions 120-L and 120-R.

In an embodiment, the contact patterns 142 may be formed by forming an insulating layer 130 to cover the monitoring pattern structure 1000 and the cover pattern layer 120 over a stack structure 110. Next, the insulating layer 130 may be selectively etched to form trench patterns 142h that selectively expose the cover pattern layer 120 and extend in one direction (e.g., the y-direction). Subsequently, the trench patterns 142h may be filled with metal to form the contact patterns 142.

As described above, in an embodiment of the present disclosure, the semiconductor wafer 1e may include a stress alleviation structure SS4 including the contact patterns 142 disposed over the monitoring pattern structure 1000. The contact patterns 142 may be disposed over the cover pattern layer 120, so that peeling of the insulating layer 130 is significantly reduced or prevented.

Although not shown in FIGS. 6A and 6B, in some embodiments, the semiconductor wafer 1e may further include a connection pattern layer disposed to cover the contact patterns 142 on a surface of the cover pattern layer 120. The connection pattern layer may be disposed to extend in a direction (e.g., the y-direction) on the first and second portions 120-L and 120-R of the cover pattern layer 120. A configuration of the connection pattern layer may be substantially the same as that of the connection pattern layer 145 described above with reference to FIGS. 4A to 4C.

Figure 7A:
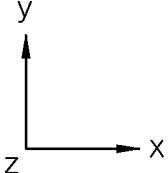
FIG. 7A is a plan view schematically illustrating a semiconductor wafer including a monitoring pattern structure according to yet another embodiment of the present disclosure.
Figure 7B:
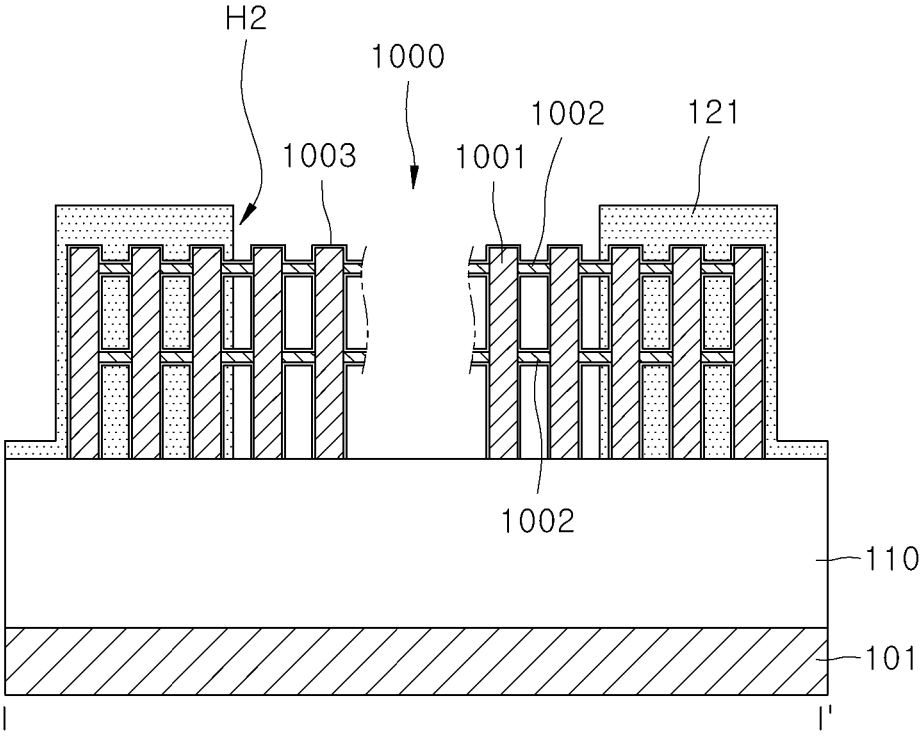
FIG. 7B is a cross-sectional view of the semiconductor wafer of FIG. 7A taken along line I-I' according to an embodiment of the present disclosure.
Figure 7B:
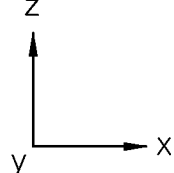
Figure 7C:
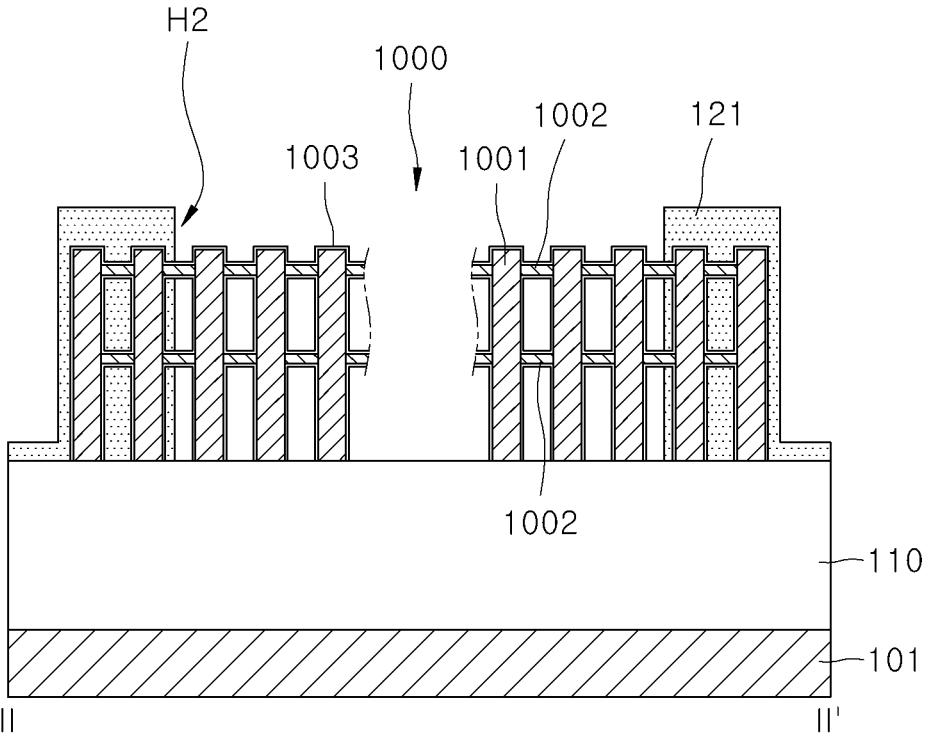
FIG. 7C is a cross-sectional view of the semiconductor wafer of FIG. 7A taken along line II-II' according to an embodiment of the present disclosure.
Figure 7C:
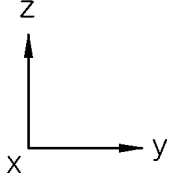

FIG. 7A is a plan view schematically illustrating a semiconductor wafer if including a monitoring pattern structure 1000 according to yet another embodiment of the present disclosure. FIG. 7B is a cross-sectional view of the semiconductor wafer of FIG. 7A taken along line I-I' according to an embodiment of the present disclosure. FIG. 7C is a cross-sectional view of the semiconductor wafer of FIG. 7A taken along line II-II' according to an embodiment of the present disclosure.

Referring to FIGS. 7A to 7C, compared to the semiconductor wafer 1a of FIGS. 2A to 2C, the semiconductor wafer if may be different from the semiconductor wafer 1a in the configuration of a cover pattern layer 121. In an embodiment, the cover pattern layer 121 may include recesses 121R formed from a hole pattern H2 toward the cover pattern layer 121.

Referring to FIG. 7A, the cover pattern layer 121 may be disposed along an edge of the monitoring pattern structure 1000. Referring to FIGS. 7A to 7C, the cover pattern layer 121 may have a shape of a fence structure having first and second widths W1 and W2. The recesses 121R of the cover pattern layer 121 may be formed in first and second portions 121-U and 121-D of the cover pattern layer 120, adjacent to upper and lower sides of the hole pattern H2.

In an embodiment, the recesses 121R may be formed in portions of the cover pattern layer 121 along a direction substantially perpendicular to the width direction of the scribe lane region 20 of FIG. 1. As an example, when the monitoring pattern structure 1000 and the cover pattern layer 121 of the semiconductor wafer 1f shown in FIGS. 7A to 7C are disposed in the first monitoring pattern formation region 30A or the fourth monitoring pattern formation region 30D of the semiconductor wafer 1 of FIG. 1, the recesses 121R of the cover pattern layer 121 of FIGS. 7A to 7C may be formed in the portions of the cover pattern layer 121 along the direction (e.g., b-direction) substantially perpendicular to the width direction (e.g., a-direction) of the scribe lane region 20 in FIG. 1. As another example, when the monitoring pattern structure 1000 and the cover pattern layer 121 of the semiconductor wafer 1f shown in FIGS. 7A to 7C are disposed in the second monitoring pattern formation region 30B or the third monitoring pattern formation region 30C of the semiconductor wafer 1 of FIG. 1, the recesses 121R of the cover pattern layer 121 of FIGS. 7A to 7C may be formed in the portions of the cover pattern layer 121 along a direction (e.g., a-direction) substantially perpendicular to the width direction (e.g., b-direction) of the scribe lane region 20 in FIG. 1. In this case, as shown in FIG. 7A, the width W1 of the cover pattern layer 121 in the portion where the recesses 121R are formed may be smaller than the width W2 of the cover pattern layer 121 in other portions where the recess 121R is not formed.

In an embodiment, the recesses 121R of the cover pattern layer 121 may increase a surface area of the monitoring pattern structure 1000 exposed by the hole pattern H2, compared to the semiconductor wafer 1a of FIGS. 2A to 2C. Accordingly, compared to the semiconductor wafer 1a of FIGS. 2A to 2C, a contact area of the insulating layer 130 and the cover pattern layer 121 may be reduced. Accordingly, peeling of the insulating layer 130 may be further alleviated. In an embodiment, each of the recesses 121R may be formed in a wedge shape in a direction substantially parallel to a direction in which the semiconductor wafer if is sawed in the scribe lane region 20 in FIG. 1. Accordingly, during the wafer sawing process described above, the plurality of chip regions 10A, 10B, 10C, and 10D of the semiconductor wafer if may be easily separated.

In an embodiment, contact patterns may be formed on the cover pattern layer 121. Configurations of the contact patterns may be substantially the same as those of the contact patterns 140 of the semiconductor wafer 1b of FIGS. 3A to 3C. Alternatively, the configurations of the contact patterns may be substantially the same as those of the contact patterns 142 of the semiconductor wafer 1e of FIGS. 6A and 6B.

Figure 8:
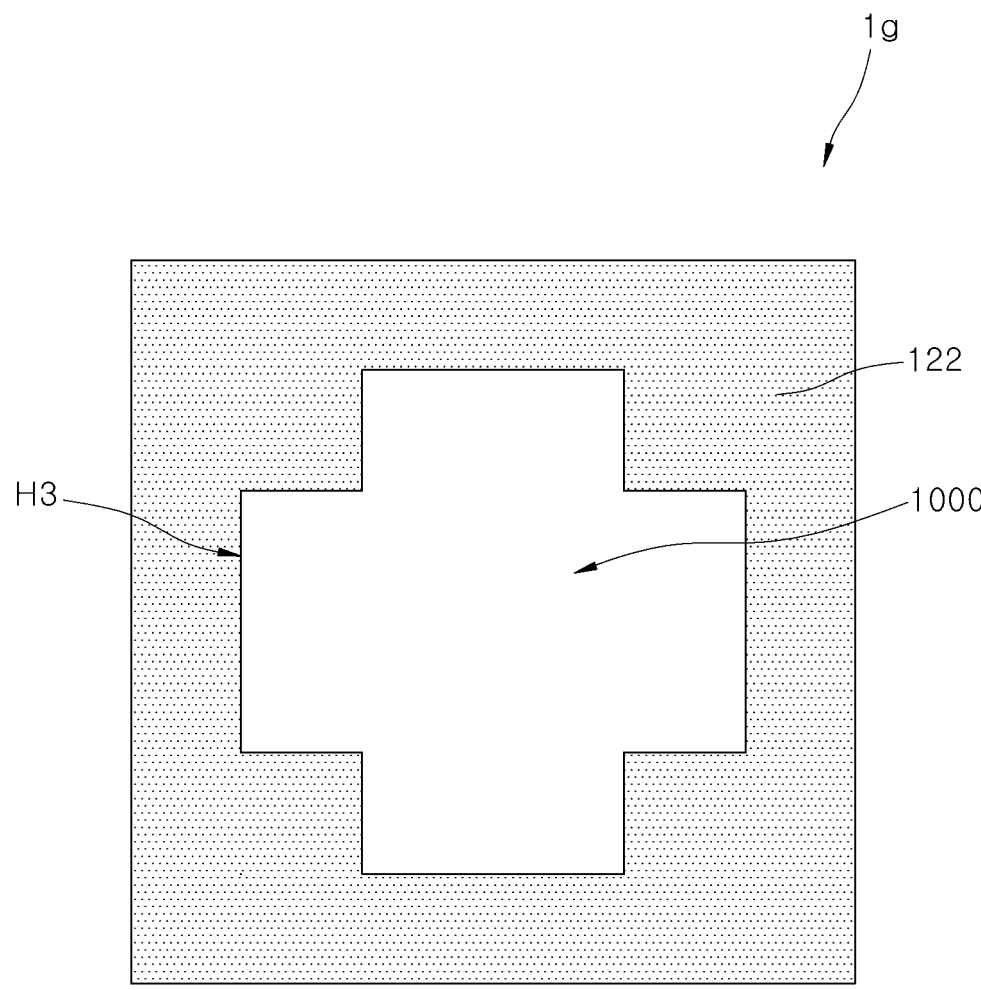
FIG. 8 is a plan view schematically illustrating a semiconductor wafer including a monitoring pattern structure according to yet another embodiment of the present disclosure.
Figure 8:
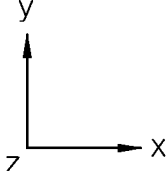

FIG. 8 is a plan view schematically illustrating a semiconductor wafer 1g including a monitoring pattern structure 1000 according to yet another embodiment of the present disclosure. Referring to FIG. 8, the semiconductor wafer 1g may be different from the semiconductor wafer 1a of FIGS. 2A to 2C in a configuration of a cover pattern layer 122, compared to the semiconductor wafer 1a. In an embodiment, the cover pattern layer 122 may include a cross-shaped hole pattern H3. The monitoring pattern structure 1000 exposed by the hole pattern H3 may be disposed to contact an insulating layer 130. That is, a contact area between the cover pattern layer 122 and the insulating layer 130 may be reduced by the hole pattern H3, so that peeling of the insulating layer 130 is significantly reduced or prevented. A configuration of the semiconductor wafer 1g except for the cover pattern layer 122 may be substantially the same as that of the semiconductor wafer 1a of FIGS. 2A to 2C.

In an embodiment, contact patterns may be formed on the cover pattern layer 122. Configurations of the contact patterns may be substantially the same as those of the contact patterns 140 of the semiconductor wafer 1b of FIGS. 3A to 3C. Alternatively, the configurations of the contact patterns may be substantially the same as those of the contact patterns 142 of the semiconductor wafer 1e of FIGS. 6A and 6B.

Figure 9:
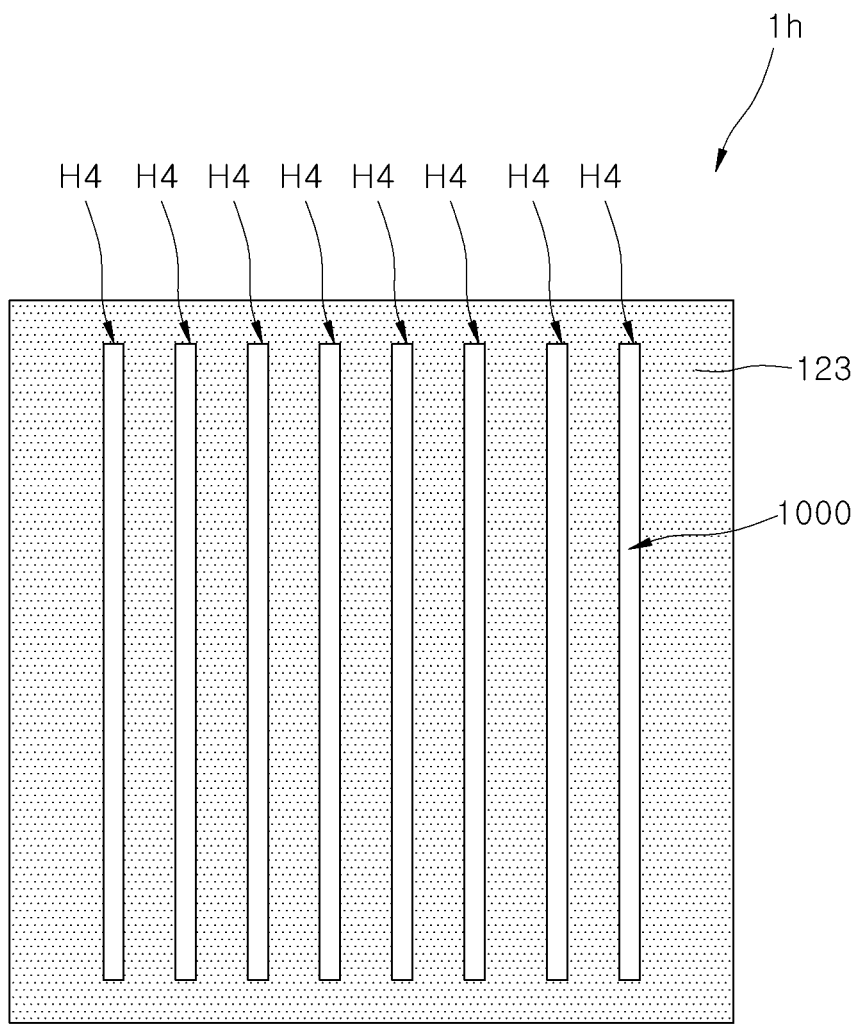
FIG. 9 is a plan view schematically illustrating a semiconductor wafer including a monitoring pattern structure according to yet another embodiment of the present disclosure.
Figure 9:
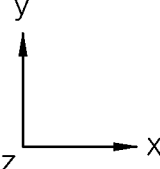

FIG. 9 is a plan view schematically illustrating a semiconductor wafer 1h including a monitoring pattern structure 1000 according to yet another embodiment of the present disclosure. Referring to FIG. 9, the semiconductor wafer 1h may be different from the semiconductor wafer 1a of FIGS. 2A to 2C in a configuration of a cover pattern layer 123, compared to the semiconductor wafer 1a. In an embodiment, the cover pattern layer 123 may include trench patterns H4 that extend in one direction (e.g., the y-direction) and expose the monitoring pattern structure 1000. The trench patterns H4 may be arranged in a direction different from the one direction (e.g., the x-direction).

Referring to FIG. 9, in an embodiment, the trench patterns H4 may extend in a direction perpendicular to the width direction of the scribe lane region 20 of FIG. 1. As an example, when the monitoring pattern structure 1000 and the cover pattern layer 123 of the semiconductor wafer 1h shown in FIG. 9 are disposed in the first monitoring pattern formation region 30A or the fourth monitoring pattern formation region 30D of the semiconductor wafer 1 of FIG. 1, the trench patterns H4 of the cover pattern layer 123 of FIG. 9 may extend in the b-direction that is substantially perpendicular to a width direction (i.e., a-direction) of the scribe lane region 20 in FIG. 1. As another example, when the monitoring pattern structure 1000 and the cover pattern layer 123 of the semiconductor wafer 1h shown in FIG. 9 are disposed in the second monitoring pattern formation region 30B or the third monitoring pattern formation region 30C of the semiconductor wafer 1 of FIG. 1, the trench patterns H4 of the cover pattern layer 123 of FIG. 9 may extend in the a-direction that is substantially perpendicular to the width direction (i.e., b-direction) of the scribe lane region 20 in FIG. 1.

According to an embodiment, the monitoring pattern structure 1000 that is partially exposed by the trench patterns H4 may be disposed to contact an insulating layer (an element 130 of FIG. 10) disposed to cover the monitoring pattern structure 1000. That is, a contact area between cover pattern layer 123 and the insulating layer may be reduced by the trench patterns H4, so that peeling of the insulating layer is significantly reduced or prevented. A configuration of the semiconductor wafer 1h except for the cover pattern layer 123 may be substantially the same as that of the semiconductor wafer 1a of FIGS. 2A to 2C.

Figure 10:
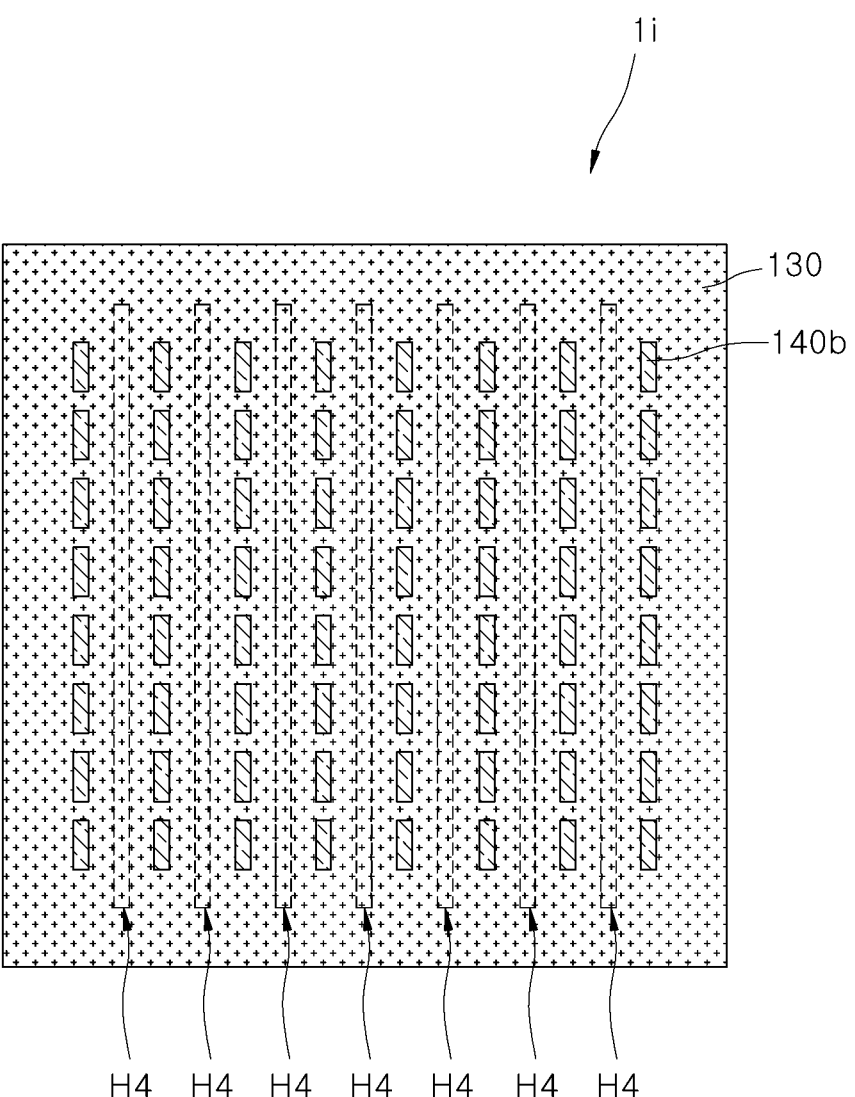
FIG. 10 is a plan view schematically illustrating a semiconductor wafer including a monitoring pattern structure according to yet another embodiment of the present disclosure.
Figure 10:
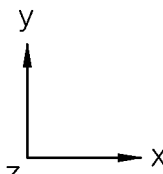

FIG. 10 is a plan view schematically illustrating a semiconductor wafer 1i including a monitoring pattern structure according to yet another embodiment of the present disclosure. Referring to FIG. 10, the semiconductor wafer 1i may further include contact patterns 140b disposed on the cover pattern layer 123 of the semiconductor wafer 1h of FIG. 9. The contact patterns 140b may be disposed inside an insulating layer 130 covering the monitoring pattern structure 1000 and the cover pattern layer 123 to be connected to the cover pattern layer 123.

The contact patterns 140b may be disposed in plural columns between the trench patterns H4. The contact patterns 140b may be disposed along one direction (e.g., the y-direction).

The configuration and functionality of the contact pattern 140b disposed on the cover pattern layer 123 may be substantially the same as the configuration and functionality of the contact pattern 140 disposed on the cover pattern layer 120 of the semiconductor wafer 1b described with reference to FIGS. 3A to 3C.

Figure 11:
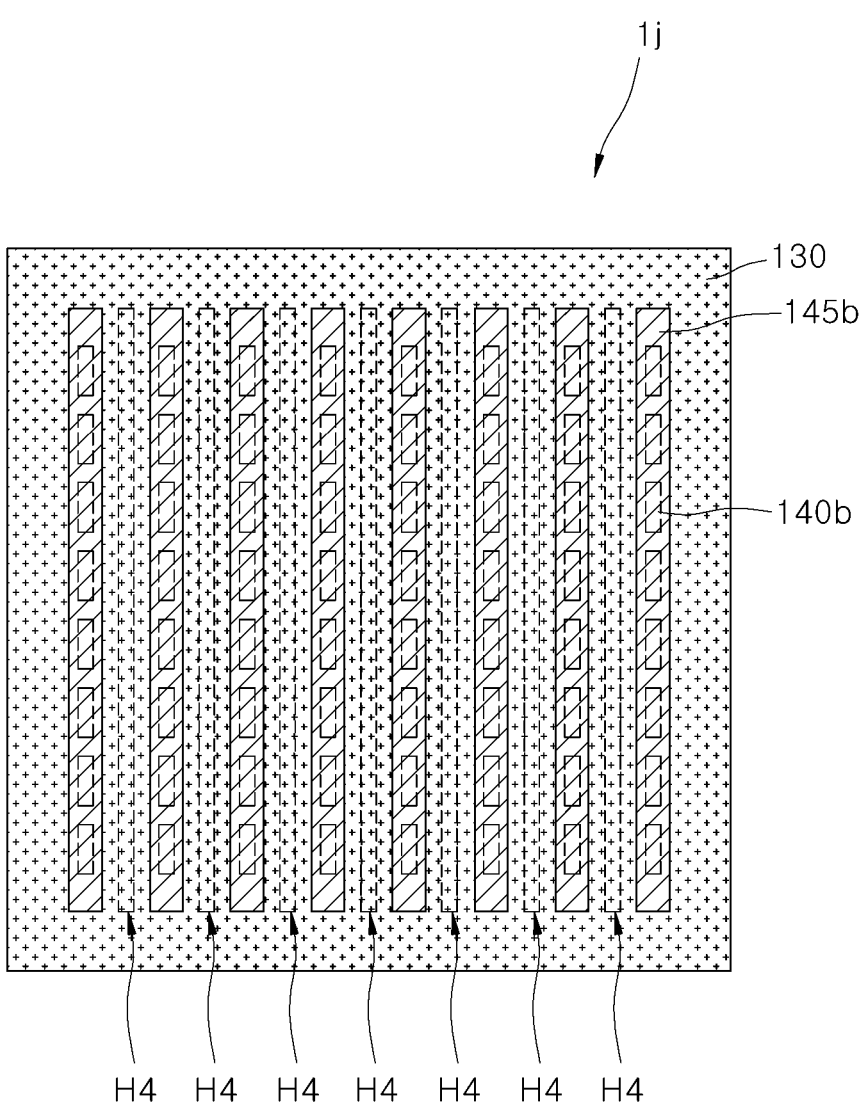
FIG. 11 is a plan view schematically illustrating a semiconductor wafer including a monitoring pattern structure according to yet another embodiment of the present disclosure.
Figure 11:
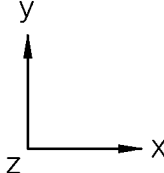

FIG. 11 is a plan view schematically illustrating a semiconductor wafer 1j including a monitoring pattern structure according to yet another embodiment of the present disclosure. Referring to FIG. 11, the semiconductor wafer 1j may further include a connection pattern layer 145b disposed to cover the contact patterns 140b of the semiconductor wafer 1i of FIG. 10. The connection pattern layer 145b may be a line pattern extending along one direction (e.g., the y-direction).

The configuration and the functionality of the connection pattern layer 145b covering the contact patterns 140b over the cover pattern layer 123 may be substantially the same as the configuration and functionality of the connection pattern layer 145a covering the contact patterns 140 over the cover pattern layer 120 of the semiconductor wafer 1d described above with reference to FIGS. 5A to 5C.

Figure 12:
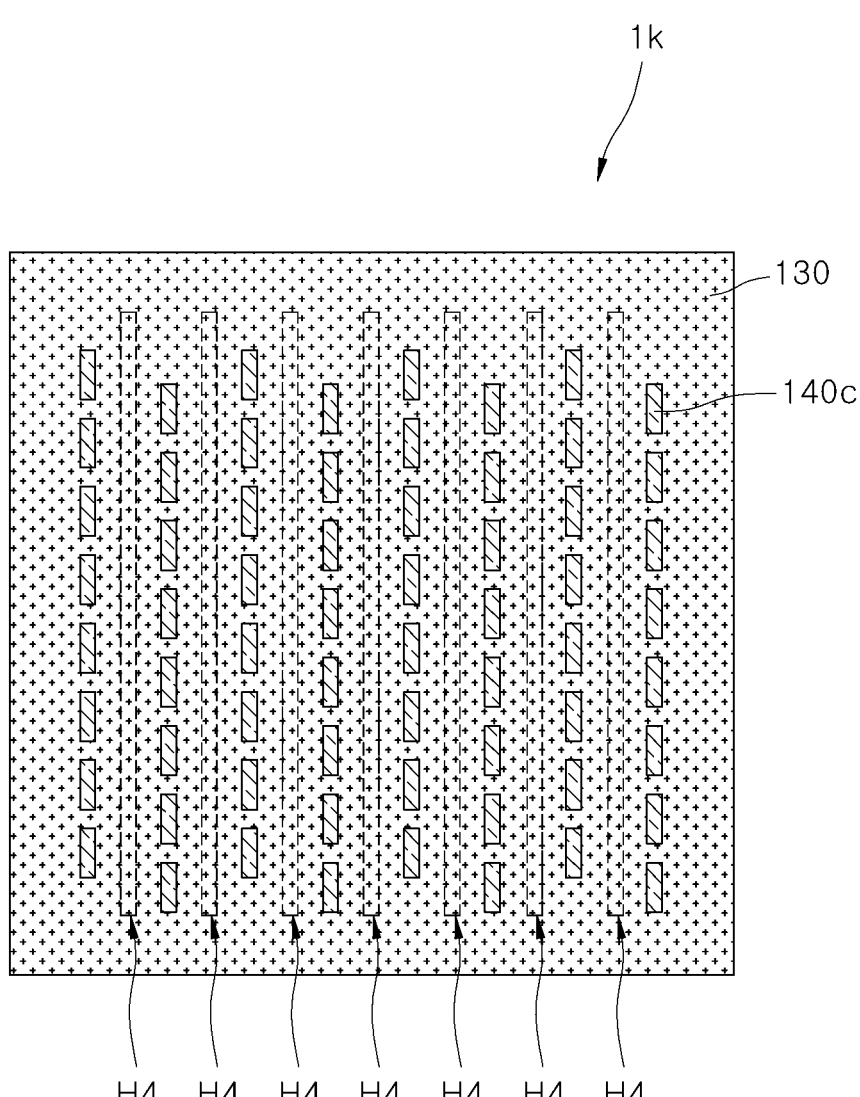
FIG. 12 is a plan view schematically illustrating a semiconductor wafer including a monitoring pattern structure according to yet another embodiment of the present disclosure.
Figure 12:
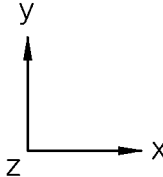

FIG. 12 is a plan view schematically illustrating a semiconductor wafer 1k including a monitoring pattern structure according to yet another embodiment of the present disclosure. Referring to FIG. 12, the semiconductor wafer 1k may be different from the semiconductor wafer 1i of FIG. 10 in configurations of contact patterns 140c, compared to the semiconductor wafer 1k. The contact patterns 140c may be disposed in plural rows along one direction (e.g., the y-direction) between trench patterns H4. The contact patterns 140c may be disposed so as to be offset with another neighboring contact patterns 140c. As an example, the contact patterns 140c may be arranged in a zigzag shape along a direction perpendicular to the one direction (e.g., an x-direction). Except for the arrangement of the contact patterns 140c, other configurations may be substantially the same as those of the semiconductor wafer 1i of FIG. 10.

Figure 13:
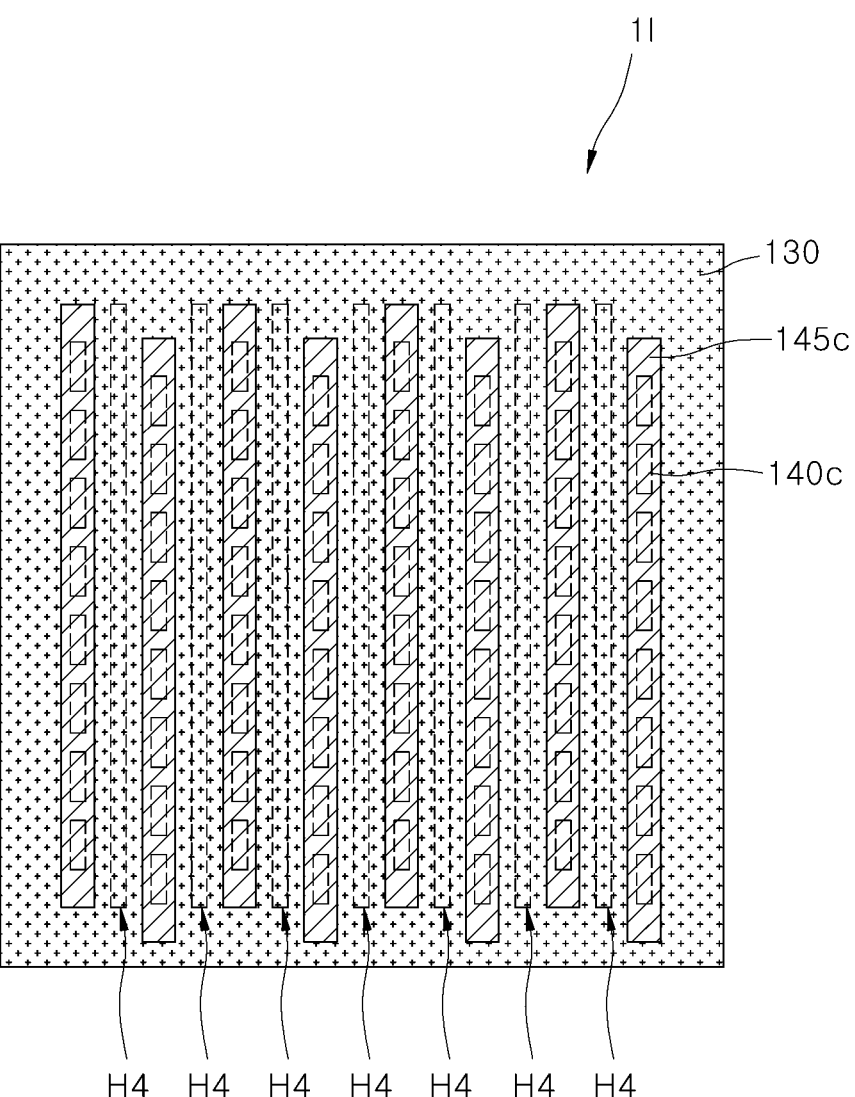
FIG. 13 is a plan view schematically illustrating a semiconductor wafer including a monitoring pattern structure according to yet another embodiment of the present disclosure.
Figure 13:
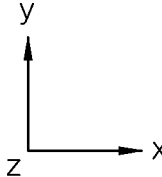

FIG. 13 is a plan view schematically illustrating a semiconductor wafer 1l including a monitoring pattern structure according to yet another embodiment of the present disclosure. Referring to FIG. 13, the semiconductor wafer 1l may further include a connection pattern layer 145c disposed to cover the contact patterns 140c of the semiconductor wafer 1k of FIG. 12. The connection pattern layer 145c may be a line pattern extending along one direction (e.g., the y-direction). Except for the arrangement of the connection pattern layer 145c, other configurations may be substantially the same as those of the semiconductor wafer 1j of FIG. 11.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts. Furthermore, the embodiments may be combined to form additional embodiments.

What is claimed is:

1. A semiconductor wafer comprising:
a monitoring pattern structure disposed over a substrate;
a cover pattern layer covering portions of the monitoring pattern structure over the substrate, the cover pattern layer including a hole pattern that selectively exposes the monitoring pattern structure;
an insulating layer disposed over the substrate, and contacting the exposed portion of the monitoring pattern structure through the hole pattern; and
contact patterns disposed over the cover pattern layer to extend over the cover pattern layer,
wherein the cover pattern layer comprises a conductive material.

2. The semiconductor wafer of claim 1, wherein the hole pattern has a plane shape of a circle, an ellipse, or a polygon.

3. The semiconductor wafer of claim 1, wherein the cover pattern layer is disposed along an edge of the monitoring pattern structure.

4. The semiconductor wafer of claim 1, wherein the monitoring pattern structure is disposed in a scribe lane region positioned between a plurality of chip regions of the substrate.

5. The semiconductor wafer of claim 4, wherein the cover pattern layer includes a trench pattern that extends in a direction substantially perpendicular to a width direction of the scribe lane region.

6. The semiconductor wafer of claim 4, wherein the cover pattern layer includes a recess formed in a portion of the cover pattern layer along a direction substantially perpendicular to the width direction of the scribe lane region.

7. The semiconductor wafer of claim 6, wherein a width of the cover pattern layer in the portion where the recess is formed is smaller than a width of the cover pattern layer in other portions where the recess is not formed.

8. The semiconductor wafer of claim 4, wherein the contact patterns include pillar structures disposed on an upper surface of the cover pattern layer and arranged along a direction substantially perpendicular to a width direction of the scribe lane region.

9. The semiconductor wafer of claim 4, wherein the contact patterns include wall structures disposed on an upper surface of the cover pattern layer and extending in a direction substantially perpendicular to a width direction of the scribe lane region.

10. The semiconductor wafer of claim 1, further comprising a connection pattern layer disposed on a surface over the cover pattern layer to cover the contact patterns.

11. The semiconductor wafer of claim 10,
wherein the cover pattern layer includes nitride of a first metal,
wherein the contact pattern includes the first metal, and
wherein the connection pattern layer includes a second metal that is different from the first metal.

12. A semiconductor wafer comprising:
a monitoring pattern structure disposed in a scribe lane region disposed between chip regions over a substrate;
a cover pattern layer covering a portion of the monitoring pattern structure disposed over the substrate, the cover pattern layer including hole patterns or trench patterns that selectively expose the monitoring pattern structure;
an insulating layer disposed over the substrate, and contacting the exposed portion of the monitoring pattern structure through the hole patterns; and
a stress alleviation structure including contact patterns disposed on the cover pattern layer to extend over the cover pattern layer, and
wherein the cover pattern layer comprises a conductive material.

13. The semiconductor wafer of claim 12, wherein the cover pattern layer is disposed along an edge of the monitoring pattern structure.

14. The semiconductor wafer of claim 13, wherein the cover pattern layer includes a recess formed along a direction substantially perpendicular to a width direction of the scribe lane region.

15. The semiconductor wafer of claim 12, wherein the contact patterns include pillar structures disposed on an upper surface of the cover pattern layer and arranged along a direction substantially perpendicular to a width direction of the scribe lane region.

16. The semiconductor wafer of claim 12, wherein the contact patterns include wall structures disposed on an upper surface of the cover pattern layer and extending in a direction substantially perpendicular to a width direction of the scribe lane region.

17. The semiconductor wafer of claim 12, wherein the stress alleviation structure further includes a connection pattern layer covering the contact patterns over the cover pattern layer.

18. A semiconductor wafer comprising:
a monitoring pattern structure disposed in a scribe lane region positioned between a plurality of chip regions of a substrate;
a cover pattern layer disposed over an edge of the monitoring pattern structure, and including a hole pattern selectively exposing a portion of the monitoring pattern structure;

an insulating layer disposed over the substrate, and contacting the exposed portion of the monitoring pattern structure through the hole pattern; and contact patterns disposed over the cover pattern layer, and wherein the cover pattern layer comprises a conductive material.

\* \* \* \* \*